US012581650B2

(12) United States Patent
Park et al.

(10) Patent No.: US 12,581,650 B2
(45) Date of Patent: Mar. 17, 2026

(54) NON-VOLATILE MEMORY DEVICES AND ELECTRONIC SYSTEMS INCLUDING THE SAME

(71) Applicant: Samsung Electronics Co., Ltd., Suwon-si (KR)

(72) Inventors: Woo Jun Park, Suwon-si (KR); Kyung Hyun Kim, Suwon-si (KR); Kun-Woo Park, Suwon-si (KR); Jun-Youl Yang, Suwon-si (KR); Dong Woo Lee, Suwon-si (KR); Sang Hyuk Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 398 days.

(21) Appl. No.: 18/142,191

(22) Filed: May 2, 2023

(65) Prior Publication Data

US 2024/0064979 A1    Feb. 22, 2024

(30) Foreign Application Priority Data

Aug. 16, 2022    (KR) ........................ 10-2022-0102052

(51) Int. Cl.
H10B 43/27 (2023.01)
H01L 25/065 (2023.01)
(Continued)

(52) U.S. Cl.
CPC ......... H10B 43/27 (2023.02); H01L 25/0652 (2013.01); H10B 41/10 (2023.02);
(Continued)

(58) Field of Classification Search
CPC ........ H10B 43/27; H10B 41/10; H10B 41/27; H10B 41/35; H10B 41/40; H10B 43/10;
(Continued)

(56) References Cited

U.S. PATENT DOCUMENTS 8,765,598 B2    7/2014  Smith et al.
10,304,852 B1    5/2019  Cui et al.
(Continued)

FOREIGN PATENT DOCUMENTS

KR        20100091900 A        8/2010
KR        20110034816 A        4/2011
(Continued)

*Primary Examiner* — Yara B Green
*Assistant Examiner* — Fakeha Sehar
(74) *Attorney, Agent, or Firm* — Wolf, Greenfield & Sacks, P.C.

(57) ABSTRACT

A non-volatile memory device comprises a substrate, a mold structure that includes gate electrodes stacked on the substrate and mold insulating layers alternately stacked with the gate electrodes, a cell contact on the substrate, wherein the cell contact is electrically connected to a selection gate electrode of the gate electrodes and is not electrically connected to a non-selection gate electrode of the gate electrodes, an insulating ring on the substrate, wherein the insulating ring is between the non-selection gate electrode and a sidewall of the cell contact and is in contact with the non-selection gate electrode, and a high dielectric constant layer between respective ones of the gate electrodes and the mold insulating layers, wherein the insulating ring includes a first portion that overlaps the high dielectric constant layer in a vertical direction, and a second portion that does not overlap the high dielectric constant layer in the vertical direction.

20 Claims, 29 Drawing Sheets

(51) Int. Cl.

| | |
|---|---|
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |
| *H10B 43/40* | (2023.01) |
| *H10B 80/00* | (2023.01) |

(52) U.S. Cl.
CPC ............. *H10B 41/27* (2023.02); *H10B 41/35* (2023.02); *H10B 41/40* (2023.02); *H10B 43/10* (2023.02); *H10B 43/35* (2023.02); *H10B 43/40* (2023.02); *H10B 80/00* (2023.02)

(58) Field of Classification Search
CPC ........ H10B 43/35; H10B 43/40; H10B 80/00; H10B 43/50; H10B 41/41; H10B 41/50; H01L 25/0652; H01L 25/18
See application file for complete search history.

(56) References Cited

U.S. PATENT DOCUMENTS

| | | | |
|---|---|---|---|
| 10,748,923 B2 | 8/2020 | Son et al. | |
| 2021/0193672 A1 * | 6/2021 | Kim ...................... | H10B 43/50 |
| 2022/0102370 A1 | 3/2022 | Kwon et al. | |

FOREIGN PATENT DOCUMENTS

| | | |
|---|---|---|
| KR | 20120030817 A | 3/2012 |
| KR | 20160136919 A | 11/2016 |
| KR | 20220025771 A | 3/2022 |

* cited by examiner

NON-VOLATILE MEMORY DEVICES AND ELECTRONIC SYSTEMS INCLUDING THE SAME

CROSS-REFERENCE TO RELATED APPLICATION

This application claims priority from Korean Patent Application No. 10-2022-0102052 filed on Aug. 16, 2022 in the Korean Intellectual Property Office and all the benefits accruing therefrom under 35 U.S.C. 119, the contents of which in its entirety are herein incorporated by reference.

BACKGROUND

Technical Field

The present disclosure relates to non-volatile memory devices and electronic systems including the same.

Description of the Related Art

It can be necessary to increase the degree of integration of a non-volatile memory device to fulfill excellent performance and low cost, which are required by consumers. Since the degree of integration of the non-volatile memory device is an important factor for determining the price of a product, the non-volatile memory device can require an increased degree of integration.

In the case of a two-dimensional or planar non-volatile memory device, since the degree of integration of the two-dimensional or planar non-volatile memory device is mainly determined by an area occupied by a unit memory cell, the two-dimensional or planar non-volatile memory device is greatly affected by the level of the technique of forming a fine pattern. However, since ultra-high-priced equipment is required to form a fine pattern, the degree of integration of the two-dimensional non-volatile memory device is increasing but still restrictive. In this respect, three-dimensional non-volatile memory devices including memory cells three-dimensionally arranged have been proposed.

BRIEF SUMMARY

Aspects of the present disclosure provide non-volatile memory devices that may improve device performance and reliability.

Other aspects of the present disclosure provide electronic systems that may improve device performance and reliability.

The aspects the present disclosure are not limited to those mentioned above and additional aspects of the present disclosure, which are not mentioned herein, will be clearly understood by those skilled in the art from the following description of the present disclosure.

According to aspects of the present disclosure, there is provided a non-volatile memory device comprising, a substrate that includes a cell array region and an extension region, a mold structure that includes a plurality of gate electrodes stacked on the cell array region and the extension region and a plurality of mold insulating layers alternately stacked with the plurality of gate electrodes, wherein the plurality of gate electrodes are stacked on the extension region in a stepped shape, a channel structure on the cell array region, wherein the channel structure intersects the plurality of gate electrodes and extends at least partially through the mold structure, a cell contact on the extension region, wherein the cell contact extends at least partially through the mold structure, is electrically connected to a selection gate electrode of the plurality of gate electrodes and is not electrically connected to a non-selection gate electrode of the plurality of gate electrodes, an insulating ring on the extension region, wherein the insulating ring is between the non-selection gate electrode and a sidewall of the cell contact and is in contact with the non-selection gate electrode, and a high dielectric constant layer between respective ones of the plurality of gate electrodes and respective ones of the plurality of mold insulating layers, wherein the insulating ring includes a first portion that overlaps the high dielectric constant layer in a vertical direction, and a second portion that does not overlap the high dielectric constant layer in the vertical direction.

According to other aspects of the present disclosure, there is provided a non-volatile memory device comprising, a peripheral circuit substrate, a peripheral circuit element on the peripheral circuit substrate, a cell substrate on the peripheral circuit substrate, wherein the cell substrate includes a cell array region and an extension region, a lower mold structure that includes a plurality of lower gate electrodes stacked on the cell array region and the extension region and a plurality of lower mold insulating layers alternately stacked with the plurality of lower gate electrodes, wherein the plurality of lower gate electrodes are stacked on the extension region in a stepped shape, an upper mold structure on the lower mold structure, wherein the upper mold structure includes a plurality of upper gate electrodes stacked on the cell array region and the extension region and a plurality of upper mold insulating layers alternately stacked with the plurality of upper gate electrodes, and the plurality of upper gate electrodes are stacked on the extension region in a stepped shape, a channel structure on the cell array region, wherein the channel structure extends at least partially through the lower mold structure and the upper mold structure, a cell contact on the extension region, wherein the cell contact extends at least partially through the lower mold structure and the upper mold structure and is electrically connected to a selection gate electrode of the plurality of lower and upper gate electrodes and is not electrically connected to a plurality of non-selection gate electrodes of the plurality of lower and upper gate electrodes, an insulating ring on the extension region, wherein the insulating ring is between respective ones of the plurality of non-selection gate electrodes and a sidewall of the cell contact and is in contact with the plurality of non-selection gate electrodes, and a high dielectric constant layer between respective ones of the plurality of lower and upper gate electrodes and respective ones of the plurality of lower and upper mold insulating layers, wherein the cell contact includes a horizontal portion electrically connected to the selection gate electrode, a first vertical portion on the horizontal portion and a second vertical portion below the horizontal portion, at least a portion of the insulating ring is in contact with the first vertical portion and the second vertical portion, the insulating ring includes a first portion that overlaps the high dielectric constant layer in a vertical direction, and a second portion that does not overlap the high dielectric constant layer in the vertical direction, a height of the first portion of the insulating ring in the vertical direction is less than that of the second portion of the insulating ring, a horizontal width of the first portion of the insulating ring is greater than that of the second portion of the insulating ring, the high dielectric constant layer includes a first portion that is in contact with the selection gate electrode, and a second portion that is in contact with the plurality of non-selection gate electrodes, the first portion of the high dielectric constant layer is in contact with the cell contact, and the second portion of the high dielectric constant layer is not in contact with the cell contact.

According to other aspects of the present disclosure, there is provided an electronic system comprising, a main board, a non-volatile memory device on the main board, and a controller on the main board, wherein the controller is electrically connected to the non-volatile memory device, wherein the non-volatile memory device comprises: a substrate that includes a cell array region and an extension region, a mold structure that includes a plurality of gate electrodes stacked on the cell array region and the extension region and a plurality of mold insulating layers alternately stacked with the plurality of gate electrodes, wherein the plurality of gate electrodes are stacked on the extension region in a stepped shape, a channel structure on the cell array region, wherein the channel structure intersects the plurality of gate electrodes and extends at least partially through the mold structure, a cell contact on the extension region, wherein the cell contact extends at least partially through the mold structure, is electrically connected to a selection gate electrode of the plurality of gate electrodes and is not electrically connected to a non-selection gate electrode of the plurality of gate electrodes, an insulating ring on the extension region, wherein the insulating ring is between the non-selection gate electrode and a sidewall of the cell contact and is in contact with the non-selection gate electrode, and a high dielectric constant layer between respective ones of the plurality of gate electrodes and respective ones of the plurality of mold insulating layers, wherein the insulating ring includes a first portion that overlaps the high dielectric constant layer in a vertical direction, and a second portion that does not overlap the high dielectric constant layer in the vertical direction.

BRIEF DESCRIPTION OF DRAWINGS

The above and other aspects and features of the present disclosure will become more apparent by describing in detail illustrative embodiments thereof with reference to the attached drawings, in which:

FIG. 2 is an example circuit diagram illustrating a non-volatile memory device according to some embodiments.

FIG. 5 is a cross-sectional view taken along line B-B of FIG. 3.

FIGS. 8 to 11 are example views illustrating a non-volatile memory device according to some embodiments.

FIG. 14 is an enlarged view illustrating a region R of FIG. 13.

FIGS. 17 to 26 are intermediate views illustrating a method of manufacturing a non-volatile memory device according to some embodiments.

DETAILED DESCRIPTION OF THE DISCLOSURE

Hereinafter, a non-volatile memory device according to some embodiments will be described with reference to FIGS. 1 to 16.

Figure 1:
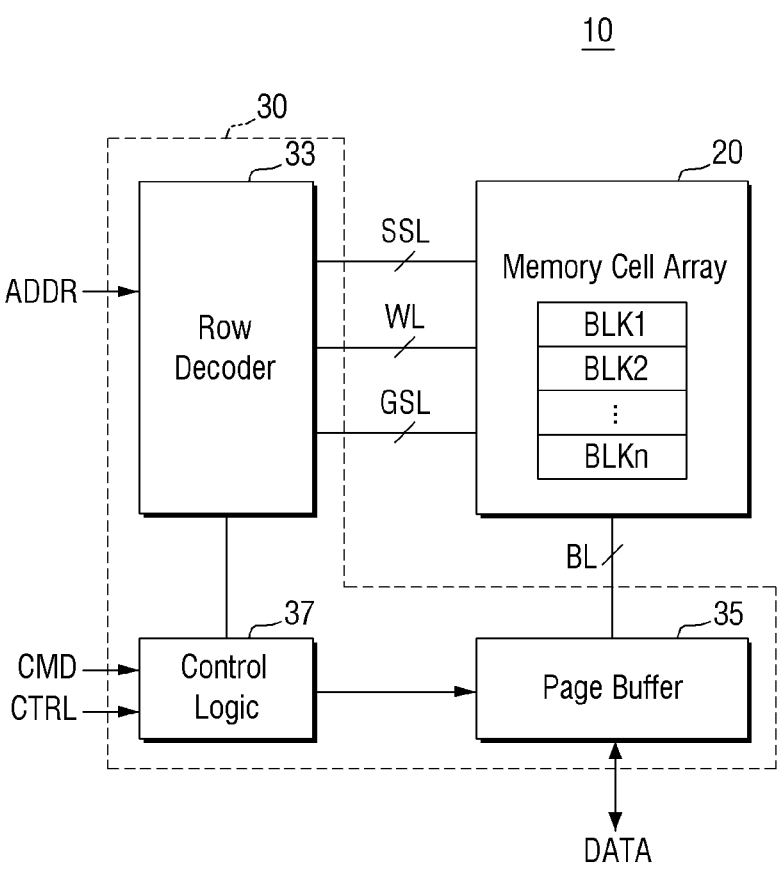
FIG. 1 is an example block diagram illustrating a non-volatile memory device according to some embodiments.

FIG. 1 is an example block diagram illustrating a non-volatile memory device according to some embodiments.

Referring to FIG. 1, a non-volatile memory device 10 according to some embodiments may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string selection line SSL and at least one ground selection line GSL. In detail, the memory cell blocks BLK1 to BLKn may be connected to a row decoder 33 through the word line WL, the string selection line SSL and the ground selection line GSL. Also, the memory cell blocks BLK1 to BLKn may be connected to a page buffer 35 through the bit line BL.

The peripheral circuit 30 may receive an address ADDR, a command CMD and a control signal CTRL from the outside of the non-volatile memory device 10 (e.g., from a source external to the non-volatile memory device 10), and may transmit and receive data DATA to and from an external device of the non-volatile memory device 10. The peripheral circuit 30 may include a control logic 37, a row decoder 33 and a page buffer 35. Although not shown, the peripheral circuit 30 may further include various sub-circuits such as an input/output circuit, a voltage generation circuit for generating various voltages required for an operation of the non-volatile memory device 10, and an error correction circuit for correcting an error of the data DATA read from the memory cell array 20.

The control logic 37 may be connected to the row decoder 33, the input/output circuit and the voltage generation circuit. The control logic 37 may control an overall operation of the non-volatile memory device 10. The control logic 37 may generate various internal control signals used in the non-volatile memory device 10 in response to the control signal CTRL. For example, when a memory operation such as a program operation or an erase operation is performed, the control logic 37 may adjust a voltage level provided to the word line WL and the bit line BL.

The row decoder 33 may select at least one of the plurality of memory cell blocks BLK1 to BLKn in response to the address ADDR, and may select at least one word line WL, at least one string selection line SSL and at least one ground selection line GSL of the selected memory cell blocks BLK1 to BLKn. Also, the row decoder 33 may transfer a voltage for performing the memory operation to the word line WL of the selected memory cell blocks BLK1 to BLKn.

The page buffer 35 may be connected to the memory cell array 20 through the bit line BL. The page buffer 35 may operate as a write driver or a sense amplifier. In detail, when the program operation or write operation is performed, the page buffer 35 may operate as the write driver to apply a voltage according to the data DATA to be stored in the memory cell array 20 to the bit line BL. When a read operation is performed, the page buffer 35 may operate as the sense amplifier to sense the data DATA stored in the memory cell array 20.

Figure 2:
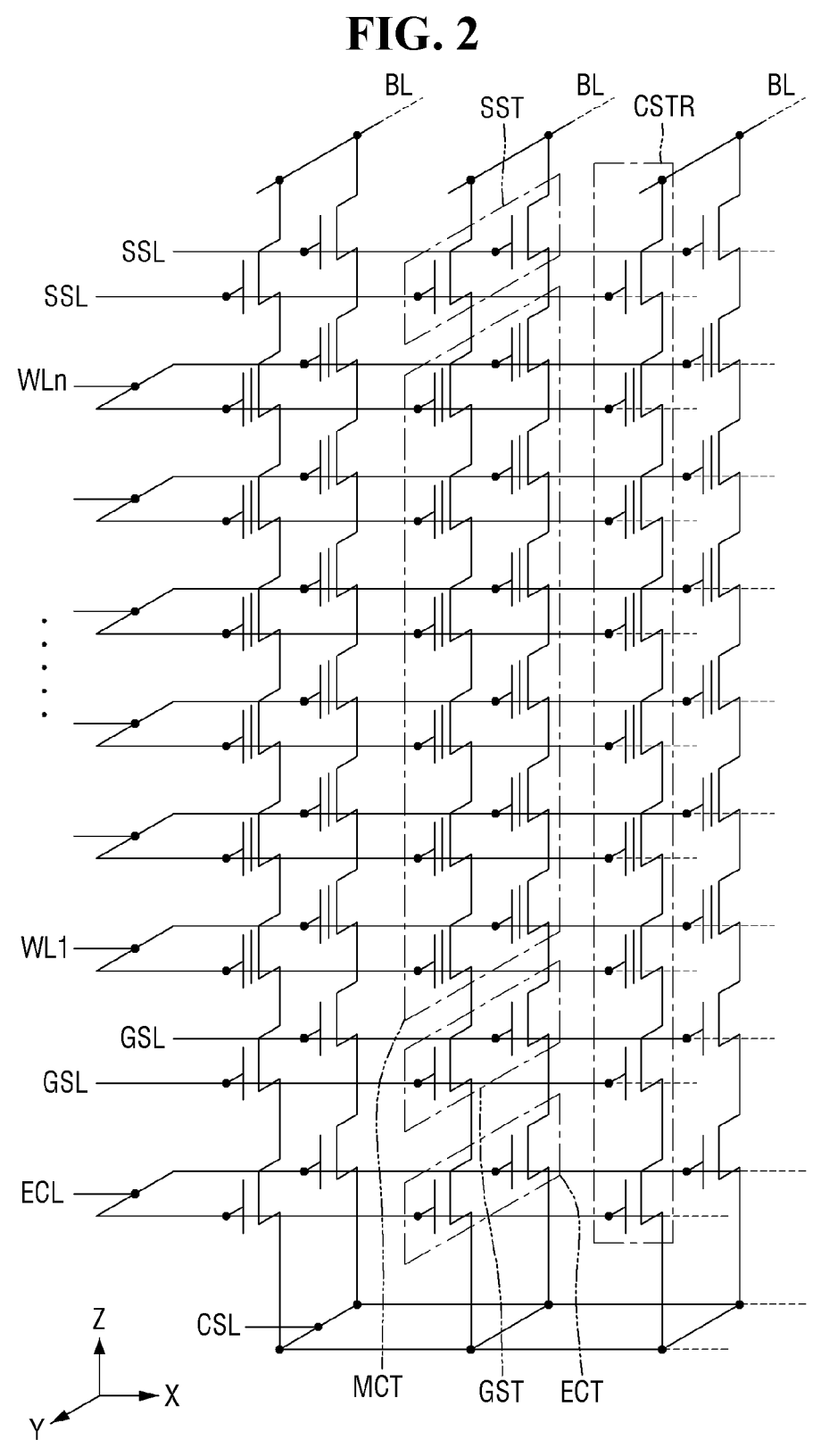

FIG. 2 is an example circuit diagram illustrating a non-volatile memory device according to some embodiments.

Referring to FIG. 2, a memory cell array (e.g., 20 of FIG. 1) of a non-volatile memory device according to some embodiments may include a common source line CSL, a plurality of bit lines BL and a plurality of cell strings CSTR.

The common source line CSL may extend in a first direction X. In some embodiments, a plurality of common source lines CSL may be two-dimensionally arranged. For example, the plurality of common source lines CSL may be spaced apart from each other and thus extend in the first direction X. The same electrical voltage may be applied to the common source lines CSL, or different voltages may be applied to the common source lines CSL so that the common source lines may be separately controlled.

The plurality of bit lines BL may be two-dimensionally arranged. For example, the bit lines BL may be spaced apart from each other and thus extend in a second direction Y crossing or intersecting the first direction X. The plurality of cell strings CSTR may be connected to the respective bit lines BL in parallel. The cell strings CSTR may be commonly connected to the common source line CSL. That is, the plurality of cell strings CSTR may be between the bit lines BL and the common source line CSL.

Each of the cell strings CSTR may include a ground selection transistor GST connected to the common source line CSL, a string selection transistor SST connected to the bit line BL, and a plurality of memory cell transistors MCT between the ground selection transistor GST and the string selection transistor SST. Each of the memory cell transistors MCT may include a data storage element. The ground selection transistor GST, the string selection transistor SST and the memory cell transistors MCT may be connected in series.

The common source line CSL may be commonly connected sources of the ground selection transistors GST. The ground selection line GSL, a plurality of word lines WL1 to WLn and the string selection line SSL may be between the common source line CSL and the bit line BL. The ground selection line GSL may be used as a gate electrode of the ground selection transistor GST, the word lines WL1 to WLn may be used as gate electrodes of the memory cell transistors MCT, and the string selection line SSL may be used as a gate electrode of the string selection transistor SST.

In some embodiments, an erase control transistor ECT may be between the common source line CSL and the ground selection transistor GST. The common source line CSL may be commonly connected sources of the erase control transistors ECT. An erase control line ECL may be between the common source line CSL and the ground selection line GSL. The erase control line ECL may be used as a gate electrode of the erase control transistor ECT. The erase control transistor ECT may perform an erase operation of the memory cell array by generating a gate induced drain leakage (GIDL).

Figure 3:
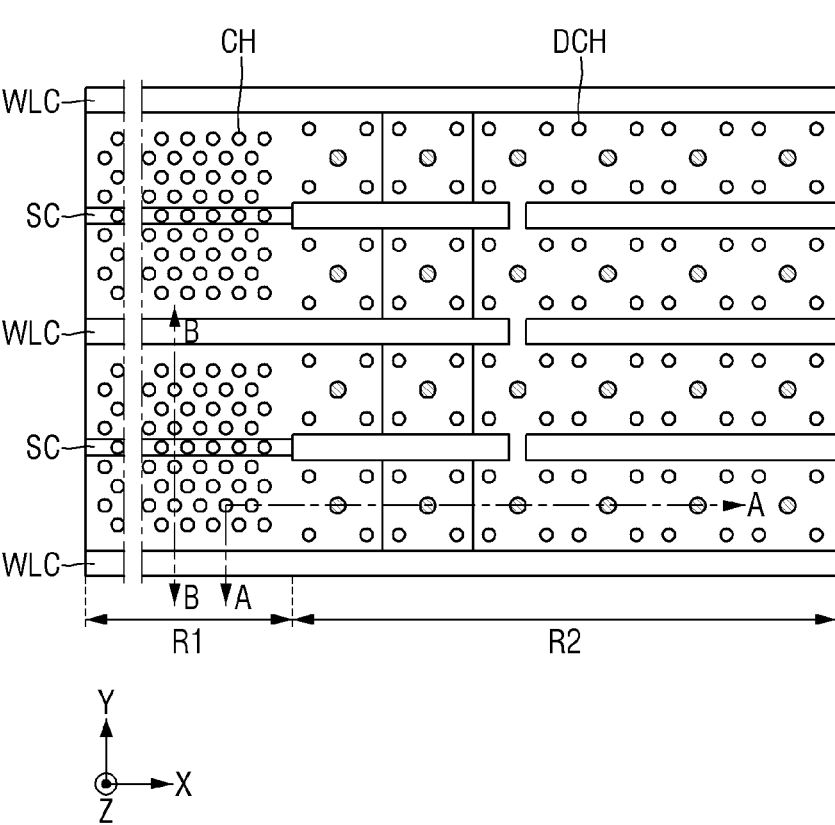
FIG. 3 is an example layout view illustrating a non-volatile memory device according to some embodiments.
Figure 4:
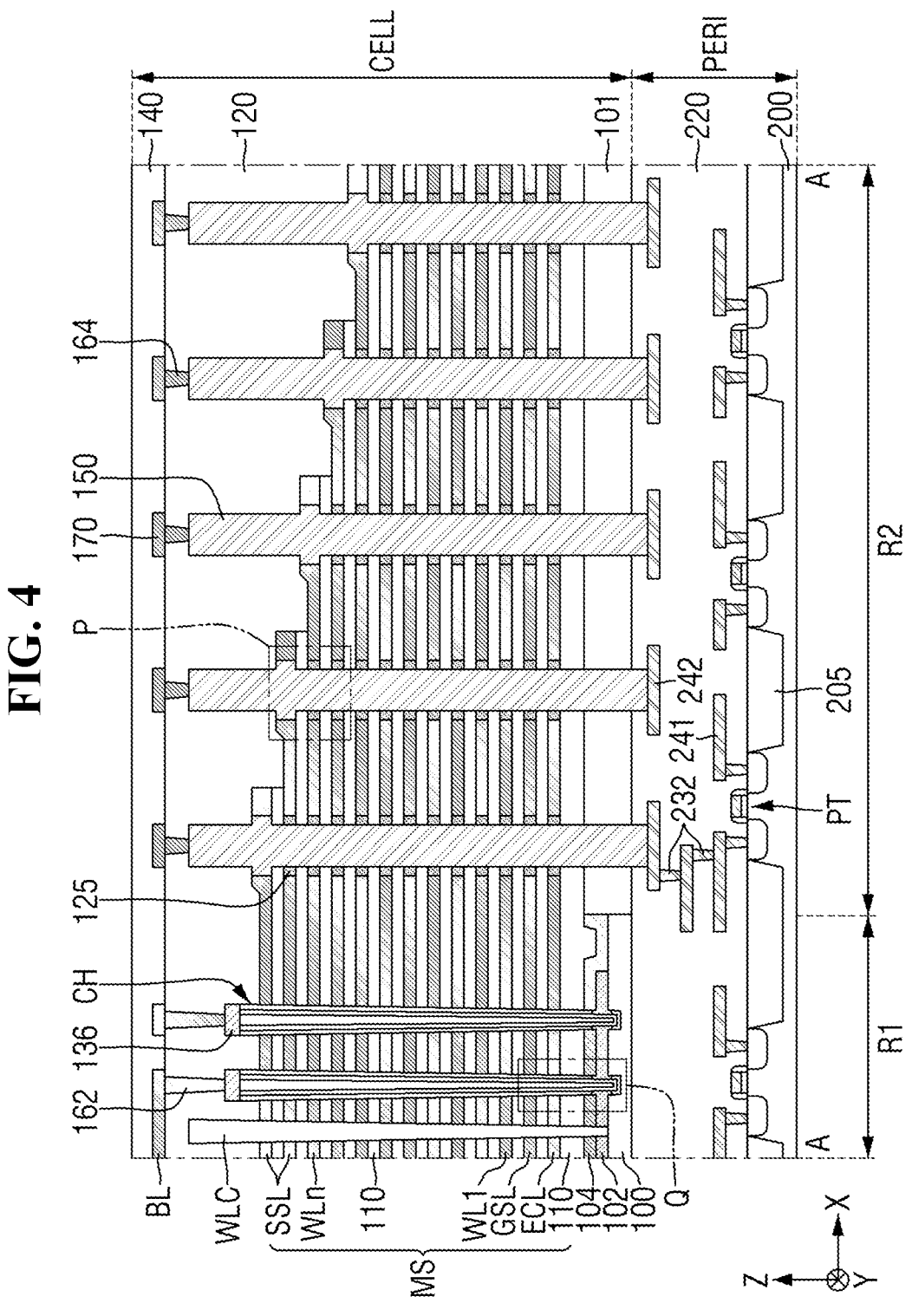
FIG. 4 is a cross-sectional view taken along line A-A of FIG. 3.
Figure 5:
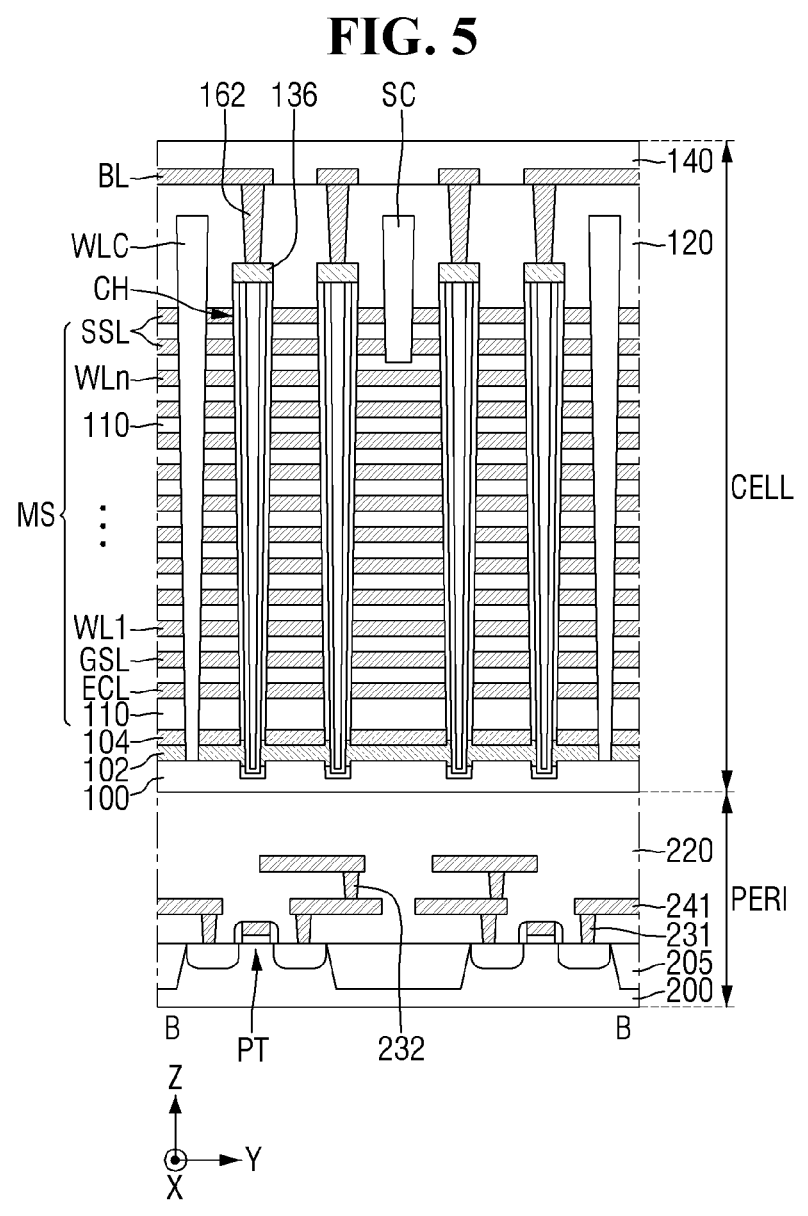
Figure 6:
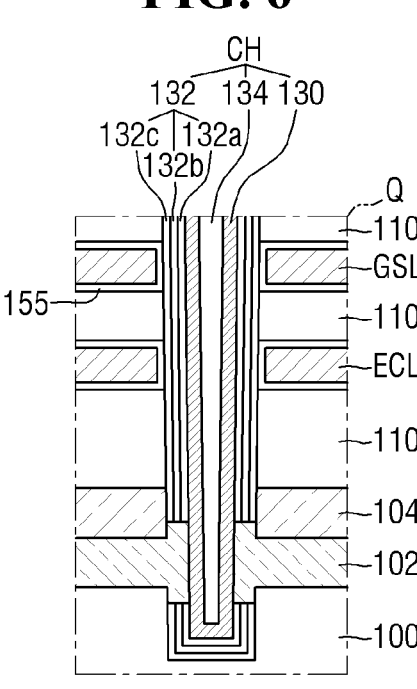
FIG. 6 is an enlarged view of a region Q of FIG. 4.
Figure 7:
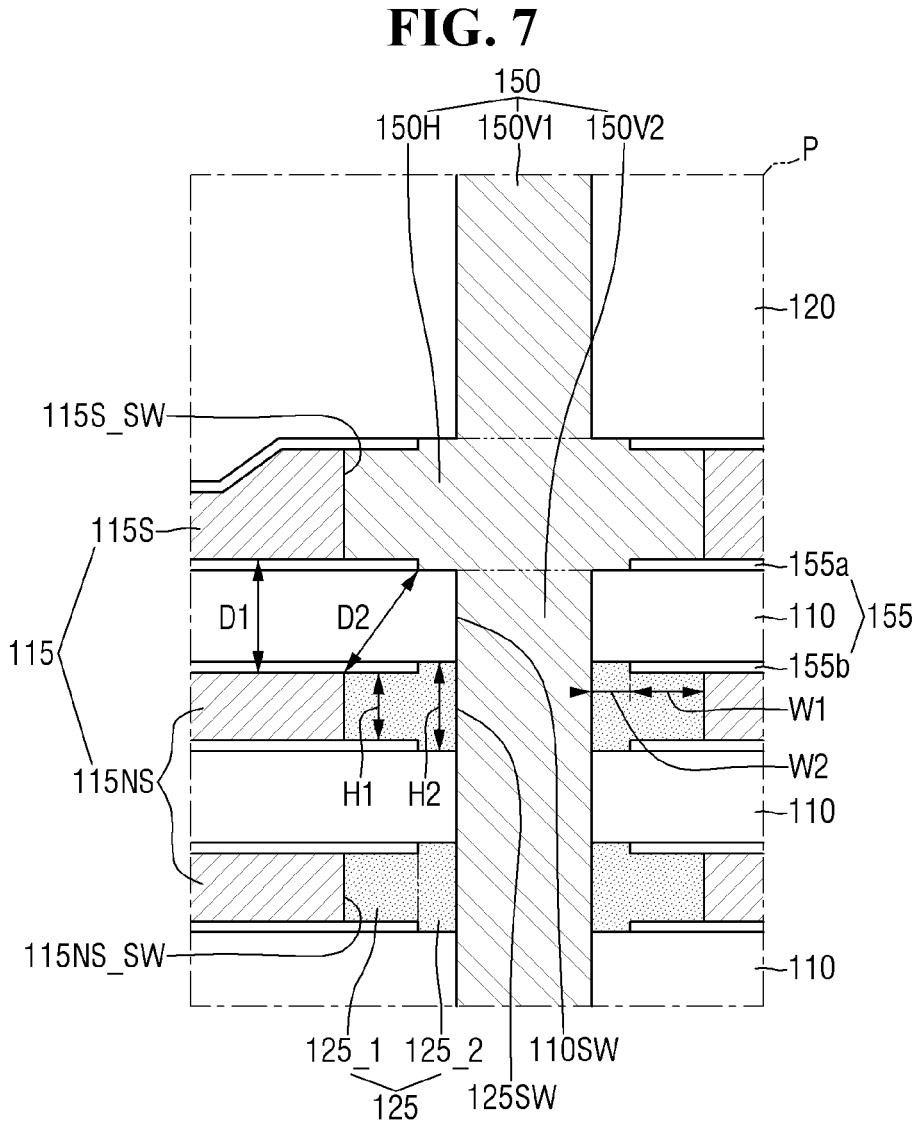
FIG. 7 is an enlarged view of a region P of FIG. 4.

FIG. 3 is an example layout view illustrating a non-volatile memory device according to some embodiments. FIG. 4 is a cross-sectional view taken along line A-A of FIG. 3. FIG. 5 is a cross-sectional view taken along line B-B of FIG. 3. FIG. 6 is an enlarged view of a region Q of FIG. 4. FIG. 7 is an enlarged view of a region P of FIG. 4.

Referring to FIGS. 3 to 7, the non-volatile memory device according to some embodiments may include a memory cell region CELL and a peripheral circuit region PERI.

The memory cell region CELL may include a cell substrate 100, an insulating substrate 101, a mold structure MS, an interlayer insulating layer 120, a channel structure CH, a block isolation region WLC, a bit line BL, a cell contact 150, an insulating ring 125, a first wiring pattern 170 and a first inter-wire insulating layer 140.

The substrate may include a cell array region R1 and an extension region R2. The substrate may include a cell substrate 100 and an insulating substrate 101, but is not limited thereto.

The cell substrate 100 may include, for example, a semiconductor substrate such as a silicon substrate, a germanium substrate or a silicon-germanium substrate. Alternatively, the cell substrate 100 may include a silicon-on-insulator (SOI) substrate or a germanium-on-insulator (GOI) substrate. In some embodiments, the cell substrate 100 may include impurities. For example, the cell substrate 100 may include an n-type impurity (e.g., phosphorus (P) or arsenic (As)).

The cell array region R1 may be provided with a memory cell array (e.g., 20 of FIG. 1) that includes a plurality of memory cells. For example, the channel structure CH, the bit line BL and gate electrodes ECL, GSL, WL1 to WLn and SSL, which will be described later, may be in the cell array region R1. In the following description, a surface of the cell substrate 100, on which the memory cell array is on, may be referred to as a front side of the cell substrate 100. On the contrary, a surface of the cell substrate 100, which is opposite to the front side of the cell substrate 100, may be referred to as a back side of the cell substrate 100.

The extension region R2 may be near the cell array region R1. The gate electrodes ECL, GSL, WL1 to WLn and SSL, which will be described later, may be stacked in the extension region R2 in a stair shape or stepped shape. Mold insulating layers 110, which will be described later, may be stacked in the extension region R2 in a stair shape or stepped shape.

The insulating substrate 101 may be provided in the extension region R2. The insulating substrate 101 may include at least one of, for example, silicon oxide, silicon nitride, silicon oxynitride or silicon carbide, but is not limited thereto. Unlike the shown example, the insulating substrate 101 may be provided in the cell substrate 100.

Although a lower surface of the insulating substrate 101 is shown as being only on a lower surface and a coplanar surface of the cell substrate 100, this is only an example. As another example, the lower surface of the insulating substrate 101 may be lower than that of the cell substrate 100.

The mold structure MS may be provided on the front side (e.g., upper surface) of the cell substrate 100. The mold structure MS may include a plurality of gate electrodes ECL, GSL, WL1 to WLn and SSL and a plurality of mold insulating layers 110, which are alternately stacked on the cell substrate 100. Each of the gate electrodes ECL, GSL, WL1 to WLn and SSL and each of the mold insulating layers 110 may have a layered structure in which they extend in parallel with the upper surface of the cell substrate 100. The gate electrodes ECL, GSL, WL1 to WLn and SSL may be spaced apart from one another by the mold insulating layers 110, and thus may be sequentially stacked on the cell substrate 100.

The gate electrodes ECL, GSL, WL1 to WLn and SSL may be stacked in the extension region R2 in a stair shape or stepped shape. For example, the gate electrodes ECL, GSL, WL1 to WLn and SSL may extend at their respective lengths different from one another in the first direction X to have a step difference. In some embodiments, the gate electrodes ECL, GSL, WL1 to WLn and SSL may have a step difference in the second direction Y. Therefore, each of the gate electrodes ECL, GSL, WL1 to WLn and SSL may include a pad region (not shown) exposed from other gate electrodes. The pad region may refer to a region in which the cell contact 150 and the gate electrodes are in contact with each other. The pad region may refer to a region in which the cell contact 150 and a selection gate electrode (115S in FIG. 7) are in contact with each other.

In some embodiments, the gate electrodes ECL, GSL, WL1 to WLn and SSL may include an erase control line ECL, a ground selection line GSL and a plurality of word lines WL1 to WLn, which are sequentially stacked on the cell substrate 100. In some other embodiments, the erase control line ECL may be omitted.

The mold insulating layers 110 may be stacked in the extension region R2 in a stair shape or stepped shape. For example, the mold insulating layers 110 may extend at their respective lengths different from each other in the first direction X to have a step difference. In some embodiments, the mold insulating layers 110 may have a step difference in the second direction Y.

Each of the gate electrodes ECL, GSL, WL1 to WLn and SSL may include a conductive material, for example, a metal such as tungsten (W), cobalt (Co), nickel (Ni) or molybdenum (Mo) or a semiconductor material such as silicon, but is not limited thereto. For example, each of the gate electrodes ECL, GSL, WL1 to WLn and SSL may include tungsten (W) or molybdenum (Mo). Unlike the shown example, the gate electrodes ECL, GSL, WL1 to WLn and SSL may be multiple layers. For example, when the gate electrodes ECL, GSL, WL1 to WLn and SSL are multiple layers, the gate electrodes ECL, GSL, WL1 to WLn and SSL may include a gate electrode barrier layer and a gate electrode filling layer. The gate electrode barrier layer may include, for example, titanium nitride (TiN) and the gate electrode filling layer may include tungsten (W), but they are not limited thereto. In some embodiments, each of the gate electrodes ECL, GSL, WL1 to WLn and SSL may include tungsten (W) or molybdenum (Mo).

The mold insulating layer 110 may include an insulating material, for example, at least one of silicon oxide, silicon nitride or silicon oxynitride, but is not limited thereto. For example, the mold insulating layer 110 may include silicon oxide.

A high dielectric constant layer 155 may be provided between the gate electrodes ECL, GSL, WL1 to WLn and SSL and the mold insulating layer 110. The high dielectric constant layer 155 may be provided between the mold insulating layer 110 and the gate electrodes ECL, GSL, WL1 to WLn and SSL, between the gate electrodes ECL, GSL, WL1 to WLn and SSL and the channel structure CH, between the mold insulating layer 110 and the insulating ring 125, or between the cell contact 150 and the mold insulating layer 110, but is not limited thereto.

The high dielectric constant layer 155 may include a material having a dielectric constant higher than that of silicon oxide. In addition, the high dielectric constant layer 155 may include a material having an etching selectivity with respect to the gate electrodes ECL, GSL, WL1 to WLn and SSL. For example, the high dielectric constant layer 155 may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof. In some embodiments, the high dielectric constant layer 155 may include hafnium oxide or aluminum oxide, but is not limited thereto.

The interlayer insulating layer 120 may be provided on the cell substrate 100. The interlayer insulating layer 120 may cover or be on the mold structure MS. The interlayer insulating layer 120 may include an oxide-based insulating material. The interlayer insulating layer 120 may include at least one of, for example, silicon oxide, silicon oxynitride or a low dielectric constant (low-k) material having a dielectric constant lower than that of silicon oxide, but is not limited thereto.

The channel structure CH may be provided in the mold structure MS of the cell array region R1. The channel structure CH may extend in a vertical direction (hereinafter, referred to as a third direction Z) crossing or intersecting the upper surface of the cell substrate 100 to pass or extend through the mold structure MS. For example, the channel structure CH may have a pillar shape (e.g., cylindrical shape) that extends in the third direction Z. Therefore, the channel structure CH may cross or intersect each of the gate electrodes ECL, GSL, WL1 to WLn and SSL.

The channel structure CH may include a semiconductor pattern 130 and an information storage layer 132.

The semiconductor pattern 130 may extend in the third direction Z to pass or extend through the mold structure MS. Although the semiconductor pattern 130 is shown as having only a cup shape or 'U' shape, this is only an example. For example, the semiconductor pattern 130 may have various shapes such as a cylindrical shape, a quadrangular cylindrical shape and a filled pillar shape. The semiconductor pattern 130 may include, for example, a semiconductor material such as monocrystalline silicon, polycrystalline silicon, an organic semiconductor material and a carbon nanostructure, but is not limited thereto.

The information storage layer 132 may be between the semiconductor pattern 130 and each of the gate electrodes ECL, GSL, WL1 to WLn and SSL. For example, the information storage layer 132 may extend along an outer side (e.g., an outer sidewall) of the semiconductor pattern 130. The information storage layer 132 may include at least one of, for example, silicon oxide, silicon nitride, silicon oxynitride or a high dielectric constant material having a dielectric constant higher than that of silicon oxide. The high dielectric constant material may include at least one of, for example, aluminum oxide, hafnium oxide, lanthanum oxide, tantalum oxide, titanium oxide, lanthanum hafnium oxide, lanthanum aluminum oxide, dysprosium scandium oxide or a combination thereof.

In some embodiments, the plurality of channel structures CH may be arranged in a zigzag shape. For example, as shown in FIG. 3, the plurality of channel structures CH may be alternately arranged in the first direction X and the second direction Y. The plurality of channel structures CH arranged in a zigzag shape may further improve the degree of integration of the non-volatile memory device. In some embodiments, the plurality of channel structures CH may be arranged in a honeycomb shape.

In some embodiments, a dummy channel structure DCH may be formed in the mold structure MS of the extension region R2. The dummy channel structure DCH may be formed in a shape similar to that of the channel structure CH to relieve stress applied to the mold structure MS in the extension region R2.

In some embodiments, the information storage layer 132 may be formed of a multi-layer. For example, as shown in FIG. 6, the information storage layer 132 may include a tunnel insulating layer 132*a*, a charge storage layer 132*b* and a blocking insulating layer 132*c*, which are sequentially stacked on the outer side of the semiconductor pattern 130.

The tunnel insulating layer 132*a* may include, for example, silicon oxide or a high dielectric constant material (e.g., aluminum oxide ($Al_2O_3$), hafnium oxide ($HfO_2$)) having a dielectric constant higher than that of silicon oxide. The charge storage layer 132*b* may include, for example, silicon nitride. The blocking insulating layer 132*c* may include, for example, silicon oxide or a high dielectric constant material (e.g., aluminum oxide ($Al_2O_3$), hafnium oxide ($HfO_2$)) having a dielectric constant higher than that of silicon oxide or silicon oxide.

In some embodiments, the channel structure CH may further include a filling pattern 134. The filling pattern 134 may be formed to fill or be in the inside of the semiconductor pattern 130 having a cup shape. The filling pattern 134 may include an insulating material, for example, silicon oxide, but is not limited thereto.

In some embodiments, the channel structure CH may further include a channel pad 136. The channel pad 136 may be formed to be connected (e.g., electrically connected) to the semiconductor pattern 130. For example, the channel pad 136 may be formed in the interlayer insulating layer 120 and thus connected to an upper portion of the semiconductor pattern 130. The channel pad 136 may include, for example, polysilicon doped with impurities, but is not limited thereto.

In some embodiments, a source layer 102 and a source support layer 104 may be sequentially formed on the cell substrate 100. The source layer 102 and the source support layer 104 may be between the cell substrate 100 and the mold structure MS. For example, the source layer 102 and the source support layer 104 may extend along the upper surface of the cell substrate 100.

In some embodiments, the source layer 102 may be formed to be connected (e.g., electrically connected) to the semiconductor pattern 130 of the channel structure CH. For example, as shown in FIG. 6, the source layer 102 may be in contact with the semiconductor pattern 130 by passing or extending through or penetrating the information storage layer 132. The source layer 102 may be provided as a common source line (e.g., CSL of FIG. 2) of the non-volatile memory device. The source layer 102 may include, for example, polysilicon doped with impurities or a metal, but is not limited thereto.

In some embodiments, the channel structure CH may pass or extend through the source layer 102 and the source support layer 104. For example, a lower portion of the channel structure CH may be buried in or may penetrate the cell substrate 100 by passing or extending through the source layer 102 and the source support layer 104.

In some embodiments, the source support layer 104 may be used as a support layer for preventing collapse or falling of the mold stack in a replacement process for forming the source layer 102.

Although not shown, a base insulating layer may be between the cell substrate 100 and the source layer 102. The base insulating layer may include at least one of, for example, silicon oxide, silicon nitride or silicon oxynitride, but is not limited thereto.

In some embodiments, the insulating substrate 101 may be formed in the extension region R2. The insulating substrate 101 may pass or extend through or penetrate the source layer 102 and the source support layer 104. Although an upper surface of the insulating substrate 101 is shown as being only on an upper surface and a coplanar surface of the source support layer 104, this is only an example. As another example, the upper surface of the insulating substrate 101 may be higher than that of the source support layer 104.

The block isolation region WLC may extend in the first direction X to cut the mold structure MS. The mold structure MS may be cut by a plurality of block isolation regions WLC to form a plurality of memory cell blocks (e.g., BLK1 to BLKn of FIG. 1). For example, two adjacent block isolation regions WLC may define one memory cell block therebetween. A plurality of channel structures CH may be in each of the memory cell blocks defined by the block isolation regions WLC.

Although FIG. 3 shows that the number of channel structures CH arranged in a zigzag shape along the second direction Y in one memory cell block is 9, this is only an example. Various modifications may be made in the number of channel structures CH in each of the memory cell blocks without limitation to the shown example.

In some embodiments, the block isolation region WLC may extend in the first direction X to cut the source layer 102 and the source support layer 104. Although a lower surface of the block isolation region WLC is shown as being only on a lower surface and a coplanar surface of the source layer 102, this is only an example. As another example, the lower surface of the block isolation region WLC may be lower than that of the source layer 102.

In some embodiments, the block isolation region WLC may include an insulating material. For example, the insulating material may fill the block isolation region WLC. The insulating material may include at least one of, for example, silicon oxide, silicon nitride or silicon oxynitride, but is not limited thereto.

In some embodiments, a string isolation structure SC may be provided in the mold structure MS. The string isolation structure SC may extend in the first direction X to cut the string selection line SSL. Each of the memory cell blocks defined by the block isolation regions WLC may be divided by the string isolation structure SC to form a plurality of string regions. For example, the string isolation structure SC may define two string regions in one memory cell block.

The bit line BL may be formed on the mold structure MS and the interlayer insulating layer 120. The bit line BL may extend in the second direction Y to cross or intersect the block isolation region WLC. In addition, the bit line BL may extend in the second direction Y and thus connected (e.g., electrically connected) to the plurality of channel structures CH arranged along the second direction Y. For example, a bit line contact 162 connected (e.g., electrically connected) to an upper portion of each of the channel structures CH may be formed in the interlayer insulating layer 120. The bit line BL may be electrically connected to the channel structures CH through the bit line contact 162.

The cell contact 150 may be provided on the substrate of the extension region R2. The cell contact 150 may extend in the third direction Z in the extension region R2 to pass or extend through the mold structure MS. The cell contact 150 may pass or extend through or penetrate the interlayer insulating layer 120 in the extension region R2. The cell contact 150 may be connected (e.g., electrically connected) to the selection gate electrode 115S in the pad region. For convenience of description, five cell contacts 150 are shown, but the present disclosure is not limited thereto.

Upper surfaces of the plurality of cell contacts 150 may be on a coplanar surface, and bottom surfaces of the plurality of cell contacts 150 may be on a coplanar surface, but the present disclosure is not limited thereto.

The insulating ring 125 may be provided in the mold structure MS. The insulating ring 125 may be between the cell contact 150 and each of the gate electrodes ECL, GSL, WL1 to WLn and SSL. A portion of the insulating ring 125 and the gate electrodes ECL, GSL, WL1 to WLn and SSL, for example, the non-selection gate electrode 115NS may be electrically insulated from the cell contact 150. For example, the insulating ring 125 may be an annular structure surrounding the cell contact 150.

The insulating ring 125 may electrically isolate other gate electrodes, which are not exposed from the pad region, among the gate electrodes ECL, GSL, WL1 to WLn and SSL from the cell contact 150. For example, the insulating ring 125 may prevent the remaining gate electrodes except the uppermost gate electrode connected to the cell contact 150 from being in contact with the cell contact 150.

The insulating ring 125 may include an insulating material. The insulating ring 125 may include, for example, an oxide-based insulating material. For example, the insulating ring 125 may include silicon oxide, but is not limited thereto.

Hereinafter, the cell contact 150 and the insulating ring 125 will be described in more detail with reference to FIG. 7.

In detail, in FIG. 7, the gate electrodes 115 may include one selection gate electrode 115S and a plurality of non-selection gate electrodes 115NS.

The selection gate electrode 115S may be in contact with the cell contact 150. The selection gate electrode 115S may be electrically connected to the cell contact 150. In some embodiments, the selection gate electrode 115S may be a gate electrode at an uppermost end of the gate electrodes, but is not limited thereto. The non-selection gate electrode 115NS may not be electrically connected to the cell contact 150. The insulating ring 125 may be between the non-selection gate electrode 115NS and the cell contact 150. The non-selection gate electrode 115NS and the cell contact 150 may be insulated from each other by the insulating ring 125.

In some embodiments, the cell contact 150 may include a horizontal portion 150H, a first vertical portion 150V1 and a second vertical portion 150V2.

The horizontal portion 150H may be connected (e.g., electrically connected) to the selection gate electrode 150S. The horizontal portion 150H may extend in the first direction X or the second direction Y. The first vertical portion 150V1 may be on the horizontal portion 150H. The first vertical portion 150V1 may extend in the third direction Z. The first vertical portion 150V1 may extend toward the bit line BL. The second vertical portion 150V2 may be below the horizontal portion 150H. The second vertical portion 150V2 may extend in the third direction Z. The second vertical portion 150V2 may extend toward the cell substrate 100. That is, the first vertical portion 150V1 and the second vertical portion 150V2 may extend in their respective directions opposite to each other.

The horizontal portion 150H may be in contact with a sidewall 115S_SW of the selection gate electrode 1155. The horizontal portion 150H may have a circular shape in a plan view, but is not limited thereto. In some embodiments, the horizontal portion 150H may include a first portion that overlaps the high dielectric constant layer 155 in the vertical direction, for example, in the third direction Z, and a second portion that does not overlap the high dielectric constant layer 155 in the vertical direction. The first portion of the horizontal portion 150H may be in contact with the selection gate electrode 115S, and the second portion of the horizontal portion 150H may not be in contact with the selection gate electrode 115S.

In some embodiments, a width of the first portion of the horizontal portion 150H in the horizontal direction (e.g., the first direction X) may be greater than that of the second portion of the horizontal portion 150H in the horizontal direction. Further, a height of the first portion of the horizontal portion 150H in the vertical direction may be lower or less than that of the second portion of the horizontal portion 150H in the vertical direction.

The first vertical portion 150V1 may be surrounded by the interlayer insulating layer 120. For example, the interlayer insulating layer 120 may be on opposing sidewalls of the first vertical portion 150V1. The first vertical portion 150V1 may not be in contact with the insulating ring 125. When the selection gate electrode 115S is a gate electrode at the uppermost end, the first vertical portion 150V1 may not be in contact with the insulating ring 125. On the other hand, the second vertical portion 150V2 may be in contact with the insulating ring 125. The second vertical portion 150V2 may be in contact with a sidewall 125SW of the insulating ring 125. In addition, the second vertical portion 150V2 may be in contact with the mold insulating layer 110. The second vertical portion 150V2 may be in contact with a sidewall 110SW of the mold insulating layer 110, but the present disclosure is not limited thereto.

In some embodiments, the insulating ring 125 may include a first portion 125_1 and a second portion 125_2.

The first portion 125_1 of the insulating ring 125 may overlap the high dielectric constant layer 155 in the vertical direction Z. The second portion 125_2 of the insulating ring 125 may not overlap the high dielectric constant layer 155 in the vertical direction Z. The first portion 125_1 of the insulating ring 125 may be in contact with the non-selection gate electrode 115NS. The first portion 125_1 of the insulating ring 125 may be in contact with a sidewall 115NS_SW of the non-selection gate electrode 115NS. The second portion 125_2 of the insulating ring 125 may be in contact with the cell contact 150. The second portion 125_2 of the insulating ring 125 may be in contact with the second vertical portion 150V2. The second portion 125_2 of the insulating ring 125 may be in contact with the mold insulating layer 110.

In some embodiments, a width W1 of the first portion 125_1 of the insulating ring 125 in the horizontal direction (e.g., in the first direction X) may be greater than a width W2 of the second portion 125_2 of the insulating ring 125 in the horizontal direction. A height H1 of the first portion 125_1 of the insulating ring 125 in the vertical direction may be lower or less than a height H2 of the second portion 125_2 of the insulating ring 125 in the vertical direction. That is, the insulating ring 125 may have a 'T' shape, which is rotated by as much as 90°, in a cross-sectional view, but the present disclosure is not limited thereto. For example, in a cross-sectional view, the insulating ring 125 may have a 'T' shape that is rotated by 90°, but the present disclosure is not limited thereto.

In some embodiments, the high dielectric constant layer 155 may include a first portion 155a and a second portion 155b.

The first portion 155a of the high dielectric constant layer 155 may be between the selection gate electrode 1155 and the mold insulating layer 110 or between the selection gate electrode 1155 and the interlayer insulating layer 120. The second portion 155b of the high dielectric constant layer 155 may be between the non-selection gate electrode 115NS and the mold insulating layer 110. The first portion 155a of the high dielectric constant layer 155 may be in contact with the cell contact 150. On the other hand, the second portion 155b of the high dielectric constant layer 155 may not be in contact with the cell contact 150. The insulating ring 125 or the mold insulating layer 110 may be between the second portion 155b of the high dielectric constant layer 155 and the cell contact 150. That is, the first portion 155a of the high dielectric constant layer 155 and the second portion 155b of the high dielectric constant layer 155 may not be electrically connected to each other.

In some embodiments, the sidewall 115S_SW of the selection gate electrode 1155 and the sidewall 115NS_SW of the non-selection gate electrode 115NS may be placed on the same plane (e.g., may be coplanar). In addition, the sidewall 125SW of the insulating ring 125 and the sidewall 110SW of the mold insulating layer 110 may be placed on the same plane (e.g., may be coplanar), but the present disclosure is not limited thereto.

In some embodiments, a minimum distance D1 between the non-selection gate electrode 115NS and the selection gate electrode 115S may be 15 nanometers (nm) or more. For example, a minimum distance D1 between the selection gate electrode 115S and a non-selection gate electrode 115NS adjacent to the selection gate electrode 115S may be 15 nm or more. For example, the non-selection gate electrode 115NS adjacent to the selection gate electrode 115S may be a non-selection gate electrode 115NS directly below the selection gate electrode 115S with the mold insulating layer 110 therebetween, but is not limited thereto. As used herein, "a minimum distance between A and B" (or similar language) may refer to a minimum distance of a straight line that connects A with B. In addition, a minimum distance D2 between the non-selection gate electrode 115NS and the cell contact 150 may be 15 nm or more. In some embodiments, the minimum distance D2 between the non-selection gate electrode 115NS and the cell contact 150 may be 40 nm or more.

In some embodiments, the high dielectric constant layer 155 may have an etching selectivity with respect to the gate electrodes 115. Therefore, the minimum distance D2 between the non-selection gate electrode 115NS and the cell contact 150 may be ensured at 40 nm or more. As a result, a non-volatile memory device with improved reliability may be manufactured.

The cell contact 150 may be connected (e.g., electrically connected) to the first wiring pattern 170 on the interlayer insulating layer 120. For example, the first inter-wire insulating layer 140 may be provided on the interlayer insulating layer 120. The first wiring pattern 170 may be formed in the first inter-wire insulating layer 140 and thus connected to the cell contact 150. The cell contact 150 and the first wiring pattern 170 may be connected to each other through a first wiring contact 164. The first wiring pattern 170 may be connected (e.g., electrically connected) to the bit line BL. The first wiring pattern 170 and the first wiring contact 164 may include a conductive material. For example, the first wiring pattern 170 and the first wiring contact 164 may include tungsten (W) or copper (Cu), but are not limited thereto.

A peripheral circuit substrate 200 may be below the cell substrate 100. For example, an upper surface of the peripheral circuit substrate 200 may face the lower surface of the cell substrate 100. The peripheral circuit substrate 200 may include, for example, a semiconductor substrate such as a silicon substrate, a germanium substrate or a silicon-germanium substrate. Alternatively, the peripheral circuit substrate 200 may include a silicon-on-insulator (SOI) substrate or a germanium-on-insulator (GOI) substrate.

A peripheral circuit element PT may be formed on the peripheral circuit substrate 200. The peripheral circuit element PT may constitute a peripheral circuit (e.g., 30 of FIG. 1) for controlling the operation of the non-volatile memory device. For example, the peripheral circuit element PT may include a control logic (e.g., 37 of FIG. 1), a row decoder (e.g., 33 of FIG. 1) and a page buffer (e.g., 35 of FIG. 1). In the following description, a surface of the peripheral circuit substrate 200 on which the peripheral circuit element PT is on may be referred to as a front side of the peripheral circuit substrate 200. On the contrary, a surface of the peripheral circuit substrate 200, which is opposite to the front side of the peripheral circuit substrate 200, may be referred to as a back side of the peripheral circuit substrate 200.

The peripheral circuit element PT may include, for example, a transistor, but is not limited thereto. For example, the peripheral circuit element PT may include various passive elements, such as a capacitor, a resistor and an inductor, as well as various active elements such as a transistor.

In some embodiments, the back side of the cell substrate 100 may face the front side of the peripheral circuit substrate 200. For example, a second inter-wire insulating layer 220 covering or on the peripheral circuit element PT may be formed on the front side of the peripheral circuit substrate 200. The cell substrate 100 and/or the insulating substrate 101 may be stacked on an upper surface of the second inter-wire insulating layer 220.

The first wiring pattern 170 may be connected (e.g., electrically connected) to the peripheral circuit element PT through the cell contact 150. For example, second wiring patterns 241 and 242 connected (e.g., electrically connected) to the peripheral circuit element PT may be formed in the second inter-wire insulating layer 220. The cell contact 150 may connect (e.g., electrically connect) the first wiring pattern 170 with the second wiring patterns 241 and 242 by passing or extending through the interlayer insulating layer 120. The second wiring patterns 241 and 242 may be connected (e.g., electrically connected) to each other through second wiring contacts 231 and 232. In addition, the second wiring patterns 241 and 242 may be electrically connected to the peripheral circuit element PT through the second wiring contacts 231 and 232. As a result, the bit line BL, each of the gate electrodes ECL, GSL, WL1 to WLn and SSL and/or the source layer 102 may be electrically connected to the peripheral circuit element PT.

The peripheral circuit elements PT may be isolated by a peripheral element isolation layer 205. For example, the peripheral element isolation layer 205 may be provided in the peripheral circuit substrate 200. The peripheral element isolation layer 205 may be a shallow trench isolation (STI) layer. The peripheral element isolation layer 205 may define an active region of the peripheral circuit elements PT. The peripheral element isolation layer 205 may include an insulating material. The peripheral element isolation layer 205 may include at least one of, for example, silicon nitride, silicon oxide or silicon oxynitride.

Hereinafter, various embodiments of the non-volatile memory device of the present disclosure will be described with reference to FIGS. 8 to 16. FIGS. 8 to 11 are example views illustrating a non-volatile memory device according to some embodiments. For convenience of description, the following description will be based on differences from the description made with reference to FIGS. 3 to 7.

Figure 8:
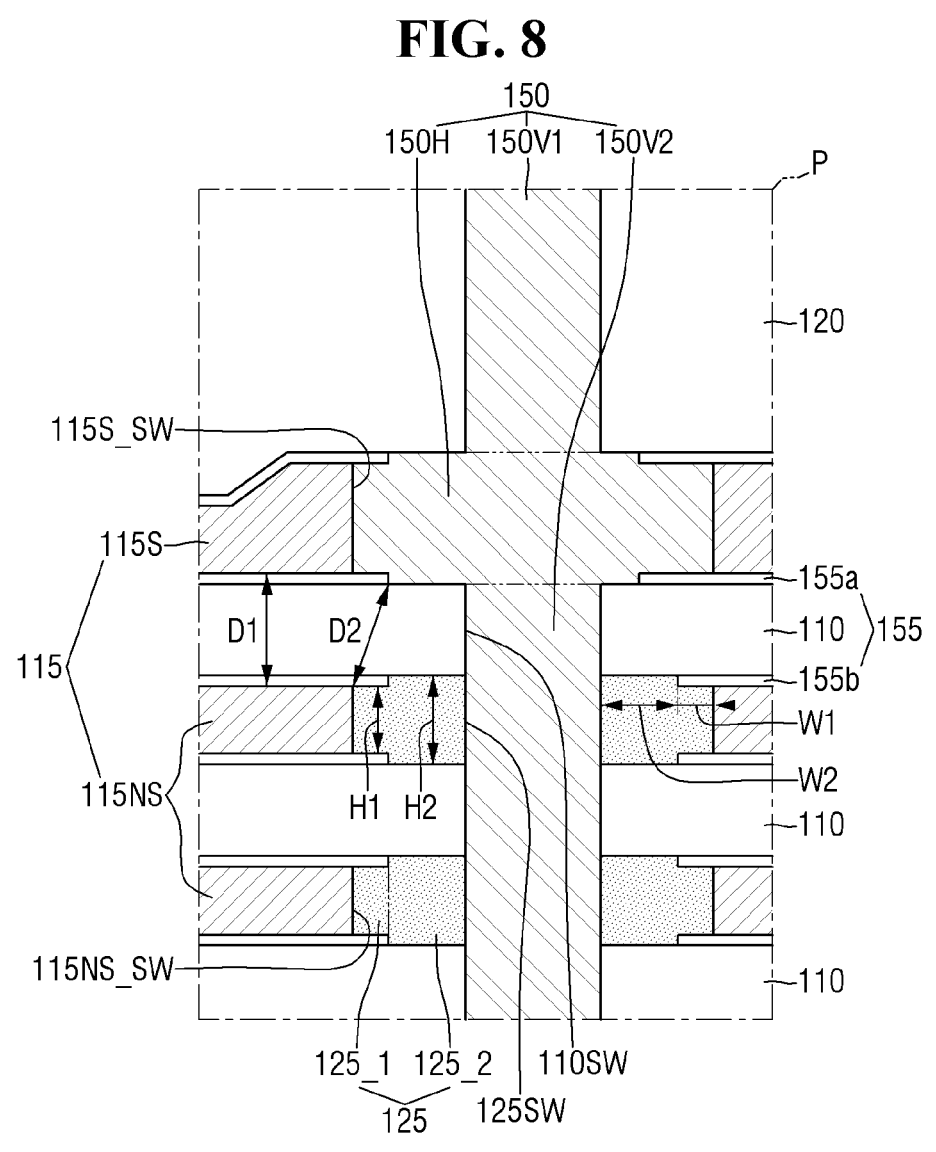

Referring to FIG. 8, the width W1 of the first portion 125_1 of the insulating ring 125 in the horizontal direction (e.g., the first direction X) may be smaller than the width W2 of the second portion 125_2 of the insulating ring 125 in the horizontal direction. When the high dielectric constant layer 155 has a large amount of etching, the width W1 of the first portion 125_1 of the insulating ring 125 in the horizontal direction may be smaller than the width W2 of the second portion 125_2 of the insulating ring 125 in the horizontal direction.

Likewise, the width of the first portion of the horizontal portion 150H in the horizontal direction (e.g., the first direction X) may be smaller than that of the second portion of the horizontal portion 150H in the horizontal direction.

Figure 9:
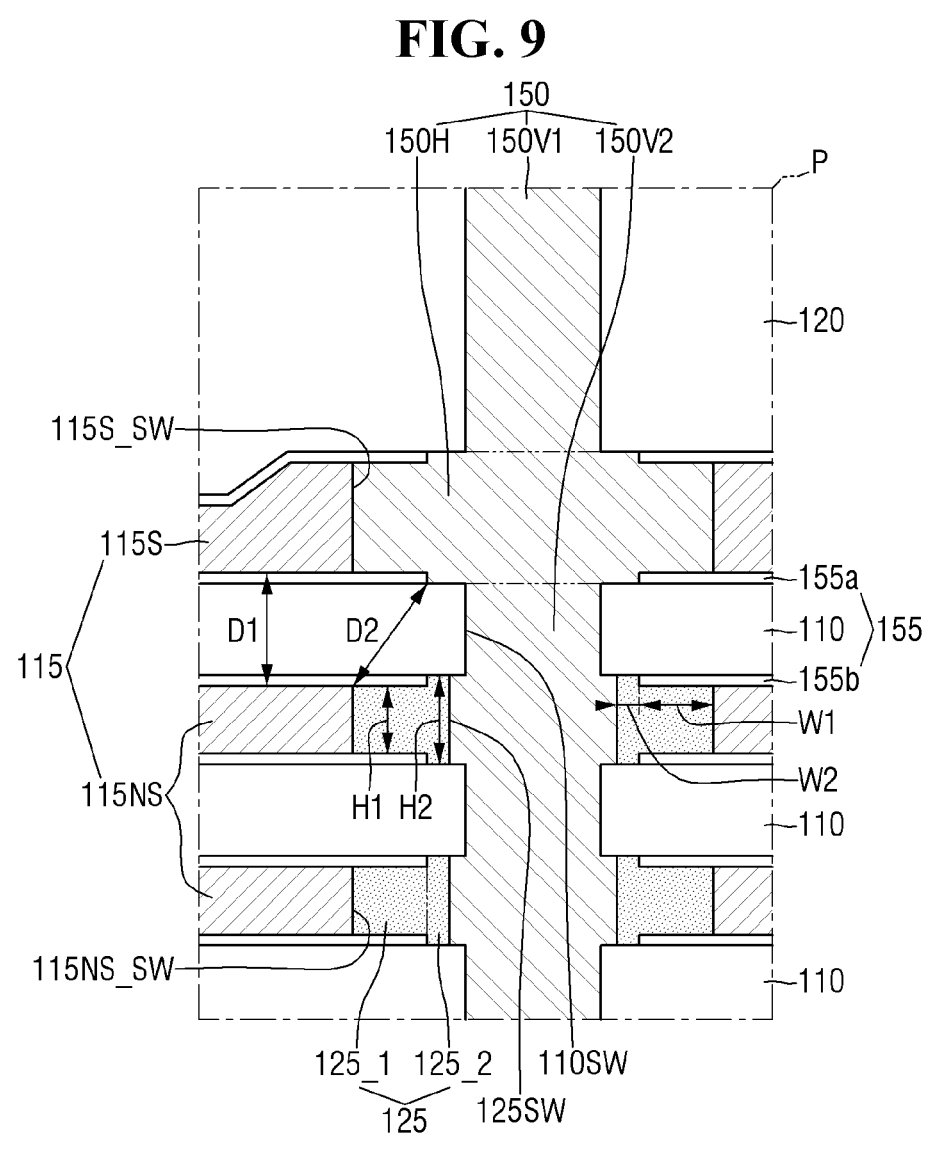

Referring to FIG. 9, the sidewall 125SW of the insulating ring 125 may not be placed on the same plane as (e.g., may not be coplanar with) the sidewall 110SW of the mold insulating layer 110.

For example, a distance between the sidewall 115NS_SW of the non-selection gate electrode 115NS and the sidewall 125SW of the insulating ring 125 may be shorter or less than a distance between the sidewall 115NS_SW of the non-selection gate electrode 115NS and the sidewall 110SW of the mold insulating layer 110. Also, at least a portion of the second vertical portion 150V2 of the cell contact 150 may overlap the mold insulating layer 110 in the third direction Z. The mold insulating layer 110 may have an etching selectivity with respect to the insulating ring 125. Therefore, the insulating ring 125 may be more etched than the mold insulating layer 110.

In some embodiments, the second portion 155b of the high dielectric constant layer 155 is not in contact with the cell contact 150. The insulating ring 125 or the mold insulating layer 110 may be between the second portion 155b of the high dielectric constant layer 155 and the cell contact 150. That is, even though the etching amount of the insulating ring 125 is increased, the insulating ring 125 may be between the second portion 155b of the high dielectric constant layer 155 and the cell contact 150.

Figure 10:
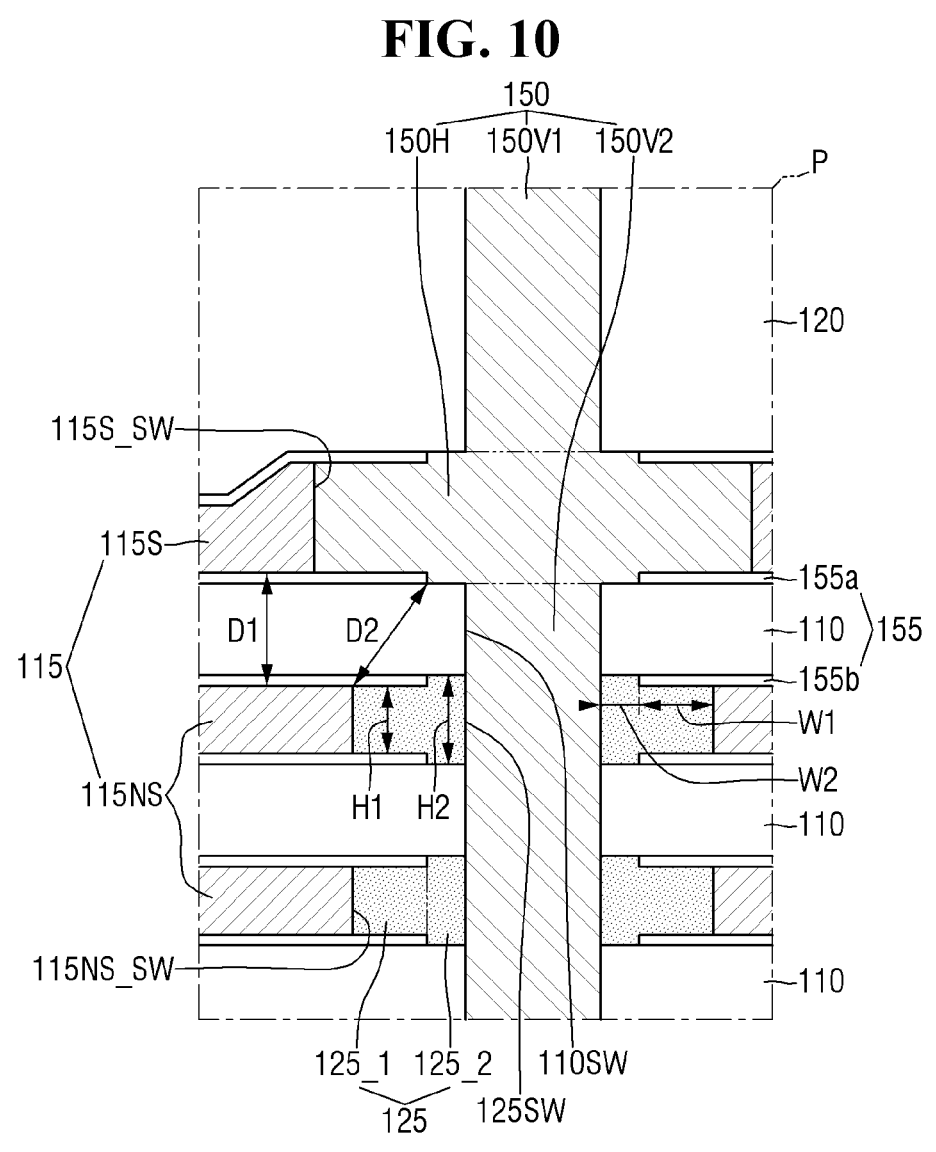

Referring to FIG. 10, the sidewall 115S_SW of the selection gate electrode 115S and the sidewall 115NS_SW of the non-selection gate electrode 115NS may not be placed on the same plane (e.g., may not be coplanar).

That is, a distance from the sidewall 110SW of the mold insulating layer 110 to the sidewall 115S_SW of the selection gate electrode 115S may be longer or greater than the distance from the sidewall 110SW of the mold insulating layer 110 to the sidewall 115NS_SW of the non-selection gate electrode 115NS. In some embodiments, a height of the sidewall 115S_SW of the selection gate electrode 115S in the vertical direction may be higher or greater than that of the sidewall 115NS_SW of the non-selection gate electrode 115NS in the vertical direction. Therefore, the etching amount of the selection gate electrode 115S and the etching amount of the non-selection gate electrode 115NS may be different from each other. When the selection gate electrode 115S is more etched than the non-selection gate electrode 115NS, the distance from the sidewall 110SW of the mold insulating layer 110 to the sidewall 115S_SW of the selection gate electrode 115S may be longer or greater than the distance from the sidewall 110SW of the mold insulating layer 110 to the sidewall 115NS_SW of the non-selection gate electrode 115NS.

Figure 11:
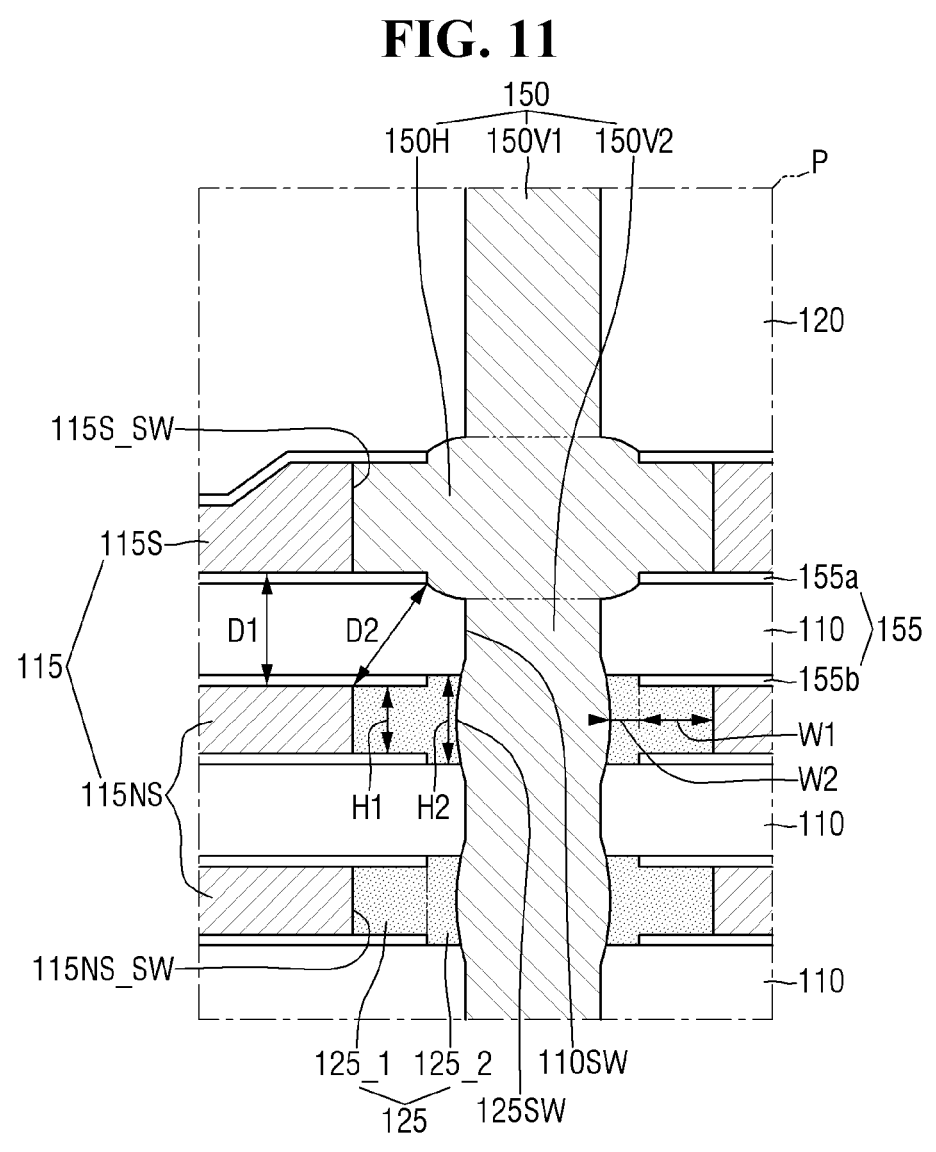

Referring to FIG. 11, the sidewall 125SW of the insulating ring 125 may have a curved or rounded shape. For example, the sidewall 125SW of the insulating ring 125 may be recessed inward. The sidewall 125SW of the insulating ring 125 may be convex with respect to the non-selection gate electrode 115NS. The distance from the sidewall 115NS_SW of the non-selection gate electrode 115NS to the sidewall 125SW of the insulating ring 125 may be gradually reduced and then increased as it becomes far away from the horizontal portion 150H. The width W2 of the second portion 125_2 of the insulating ring 125 in the horizontal direction (e.g., in the first direction X) may be gradually reduced and then increased as the second portion 125_2 of the insulating ring 125 becomes far away from the horizontal portion 150H. For example, the width W2 of the second portion 125_2 of the insulating ring 125 in the horizontal direction may be the greatest at a portion of the second portion 125_2 that is adjacent to the mold insulating layer 110.

In some embodiments, a portion where the horizontal portion 150H of the cell contact 150 is in contact with the mold insulating layer 110 may have a curved or rounded shape. A portion where the horizontal portion 150H of the cell contact 150 is in contact with the interlayer insulating layer 120 may have a curved or rounded shape. Therefore, at least a portion of the horizontal portion 150H of the cell contact 150 may overlap the mold insulating layer 110 in the horizontal direction (e.g., in the first direction X). At least a portion of the horizontal portion 150H of the cell contact 150 may overlap at least a portion of the interlayer insulating layer 120 in the horizontal direction. A minimum distance D2 between the non-selection gate electrode 115NS and the cell contact 150 may be 15 nm or more. In some embodiments, the minimum distance D2 between the non-selection gate electrode 115NS and the cell contact 150 may be 40 nm or more.

Figure 12:
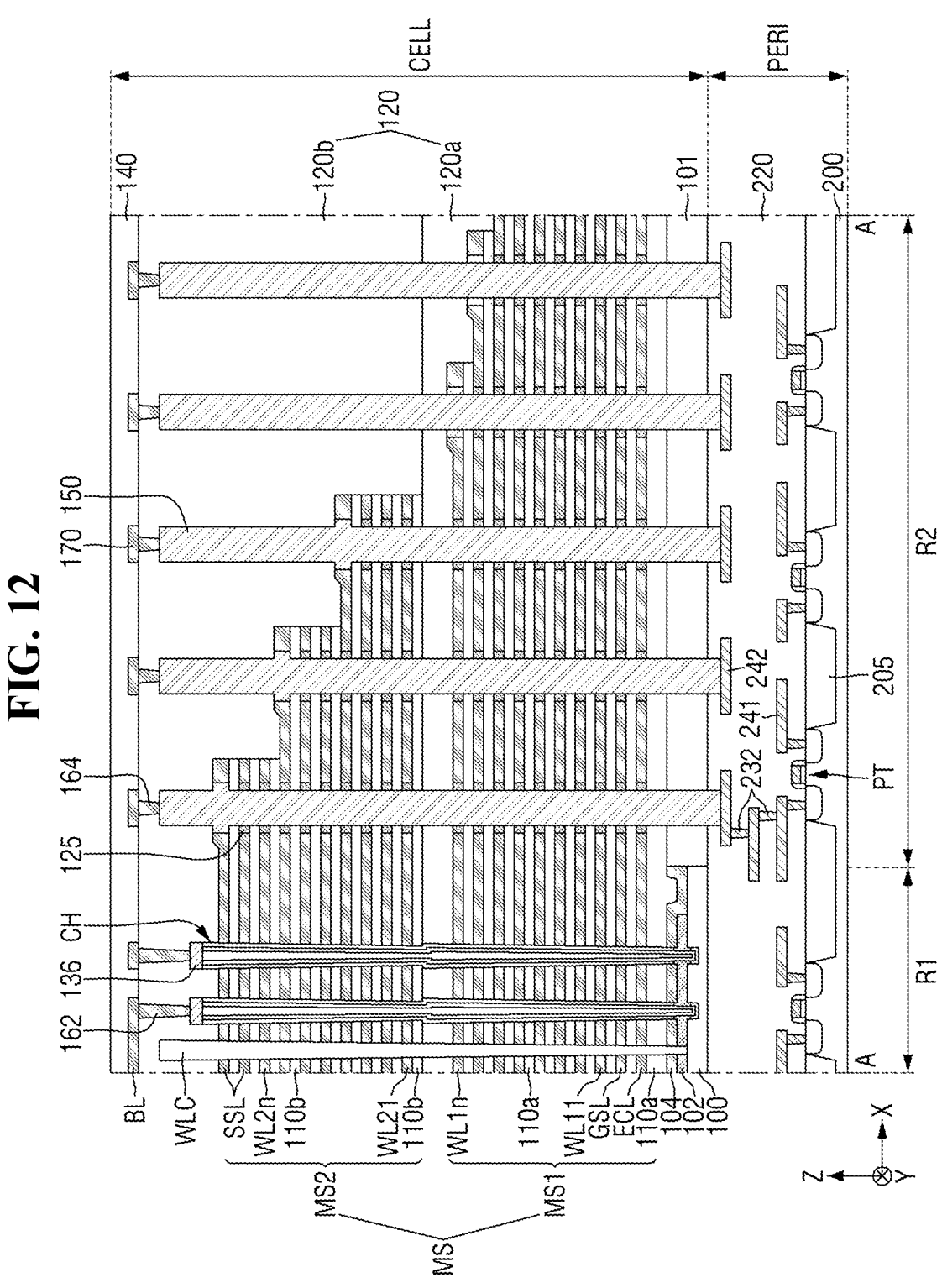
FIGS. 12 and 13 are example views illustrating a non-volatile memory device according to some embodiments.
Figure 13:
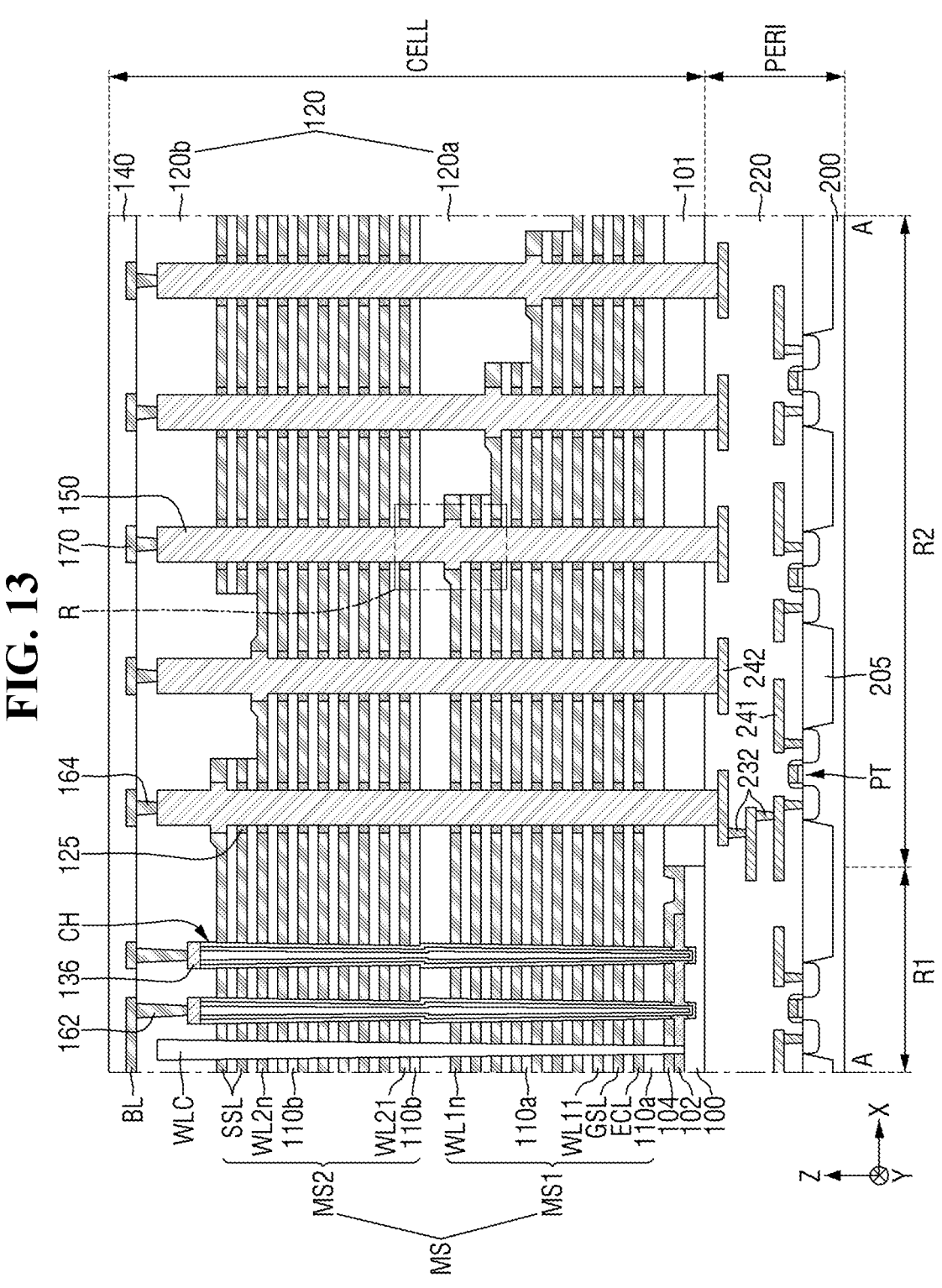
Figure 14:
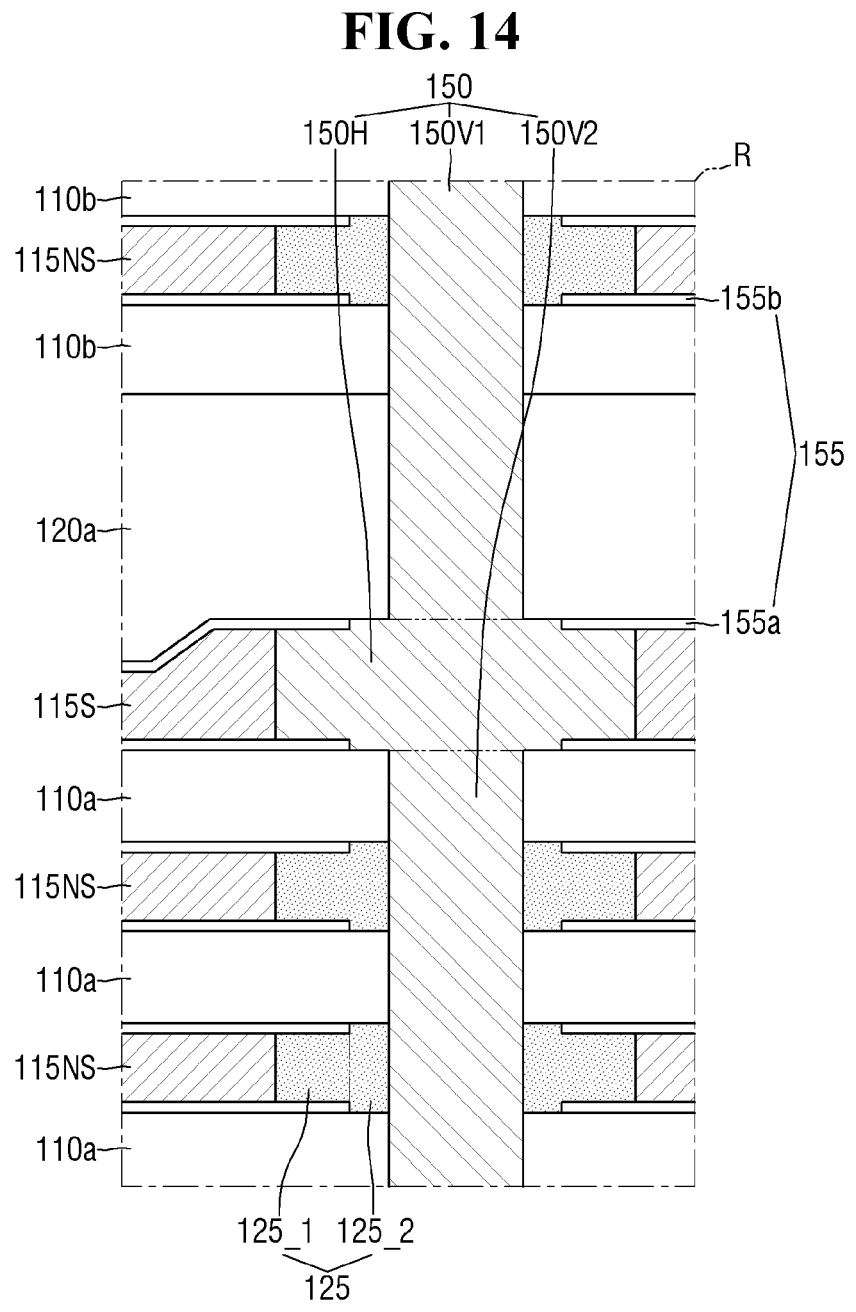

FIGS. 12 and 13 are example views illustrating a non-volatile memory device according to some embodiments. FIG. 14 is an enlarged view illustrating a region R of FIG. 13. For convenience of description, the following description will be based on differences from the description made with reference to FIGS. 3 to 7.

First, referring to FIG. 12, the non-volatile memory device according to some embodiments may be a two-stack (2-stack) non-volatile memory device. For example, the mold structure MS may include a lower mold structure MS1 and an upper mold structure MS2. The upper mold structure MS2 may be on the lower mold structure MS1.

The lower mold structure MS1 may include a plurality of lower gate electrodes ECL, GSL and WL11 to WL1n and a plurality of lower mold insulating layers 110a, which are alternately stacked on the cell substrate 100. The plurality of lower gate electrodes ECL, GSL and WL11 to WL1n and the plurality of lower mold insulating layers 110a may have a layered structure in which they extend in parallel with the upper surface of the cell substrate 100. The lower gate electrodes ECL, GSL and WL11 to WL1n may be stacked in the extension region R2 in a stair shape or stepped shape. For example, the lower gate electrodes ECL, GSL and WL11 to WL1n may extend at their respective lengths different from one another in the first direction X to have a step difference. In some embodiments, the lower gate electrodes ECL, GSL and WL11 to WL1n may have a step difference in the second direction Y.

The upper mold structure MS2 may include a plurality of upper gate electrodes WL21 to WL2n and SSL and a plurality of upper mold insulating layers 110b, which are alternately stacked on the lower mold structure MS1. The plurality of upper gate electrodes WL21 to WL2n and SSL and the plurality of upper mold insulating layers 110*b* may have a layered structure in which they extend in parallel with the upper surface of the cell substrate 100. The upper gate electrodes WL21 to WL2n and SSL may be stacked in the extension region R2 in a stair shape or stepped shape. For example, the upper gate electrodes WL21 to WL2n and SSL may extend at their respective lengths different from one another in the first direction X to have a step difference. In some embodiments, the upper gate electrodes WL21 to WL2n and SSL may have a step difference in the second direction Y.

In some embodiments, the interlayer insulating layer 120 may include a lower interlayer insulating layer 120*a* and an upper interlayer insulating layer 120*b*. The upper interlayer insulating layer 120*b* may be on the lower interlayer insulating layer 120*a*. Each of the lower interlayer insulating layer 120*a* and the upper interlayer insulating layer 120*b* may include at least one of, for example, silicon oxide, silicon oxynitride or a low dielectric constant (low-k) material having a dielectric constant lower than that of silicon oxide, but are not limited thereto.

Referring to FIG. 13, the lower gate electrodes ECL, GSL and WL11 to WL1n may be stacked in the extension region R2 in a stair shape or stepped shape, whereas the upper gate electrodes WL21 to WL2n may not be stacked in the extension region R2 in a stair shape or stepped shape. That is, a portion of the first vertical portion 150V1 of the cell contact 150 may pass or extend through or penetrate the mold structure MS. A portion of the first vertical portion 150V1 of the cell contact 150 may pass or extend through or penetrate the upper mold structure MS2.

In detail, referring to FIG. 14, the first vertical portion 150V1 of the cell contact 150 passes or extends through or penetrates the lower interlayer insulating layer 120*a*. Also, at least a portion of the first vertical portion 150V1 of the cell contact 150 may be in contact with the insulating ring 125.

The gate electrodes 115 may include one selection gate electrode 115S and a plurality of non-selection gate electrodes 115NS. The gate electrodes 115 include lower gate electrodes ECL, GSL and WL11 to WL1n and upper gate electrodes WL21 to WL2n and SSL.

In some embodiments, the selection gate electrode 115S may not be a gate electrode that is at the uppermost end among the gate electrodes 115. For example, in FIG. 14, the selection gate electrode 115S may be a gate electrode that is at the uppermost end among the lower gate electrodes ECL, GSL and WL11 to WL1n. Some of the non-selection gate electrodes 115NS may be the upper gate electrodes WL21 to WL2n and SSL.

Therefore, at least a portion of the first vertical portion 150V1 of the cell contact 150 may be in contact with the insulating ring 125. At least a portion of the second vertical portion 150V2 of the cell contact 150 may be in contact with the insulating ring 125. At least a portion of the first vertical portion 150V1 of the cell contact 150 may be in contact with the upper mold insulating layer 110*b*. At least a portion of the second vertical portion 150V2 of the cell contact 150 may be in contact with the lower mold insulating layer 110*a*.

Figure 15:
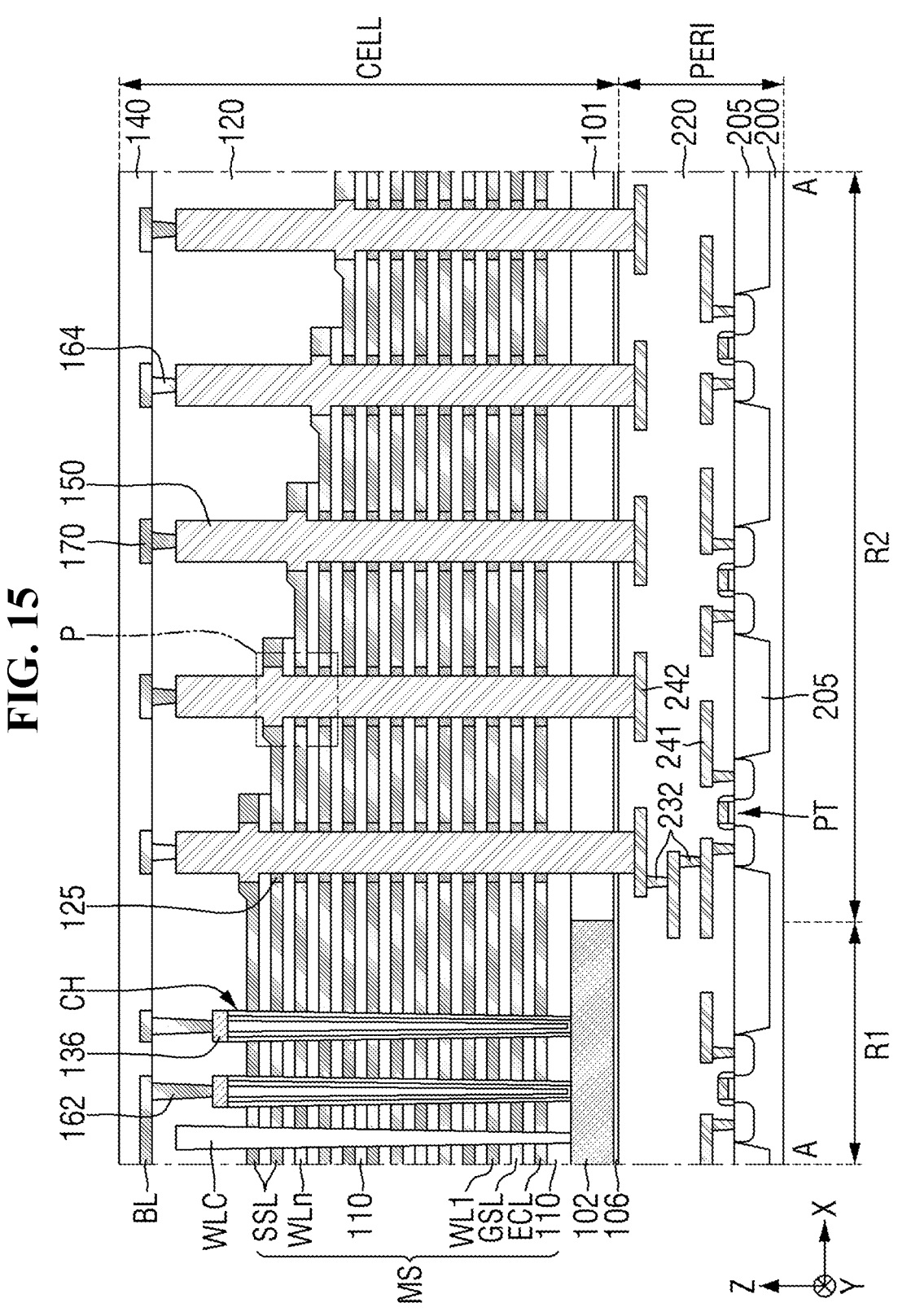
FIGS. 15 and 16 are example views illustrating a non-volatile memory device according to some embodiments.
Figure 16:
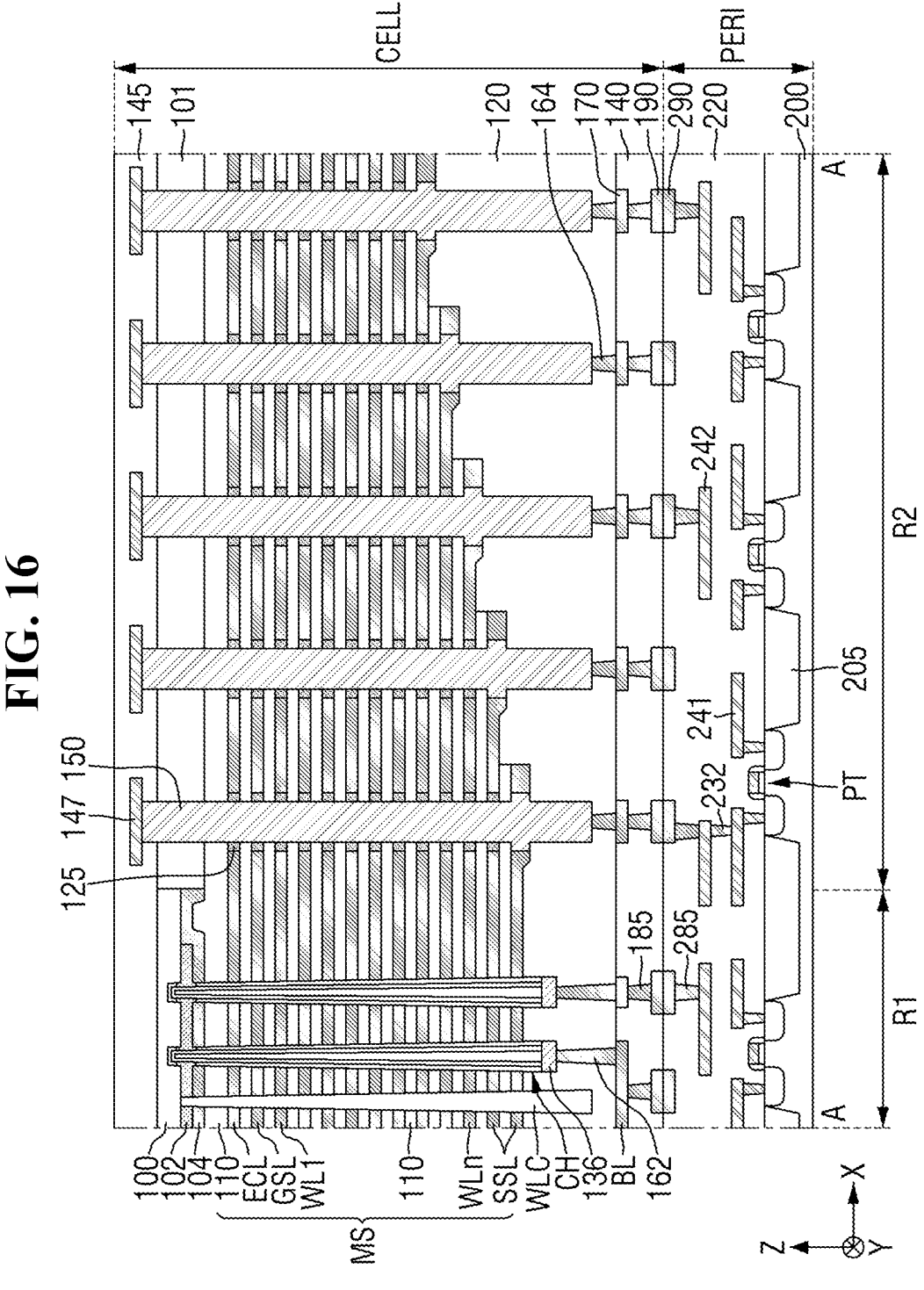

FIGS. 15 and 16 are example views illustrating a non-volatile memory device according to some embodiments. For convenience of description, the following description will be based on differences from the description made with reference to FIGS. 3 to 7.

Referring to FIG. 15, the source layer 102 may be connected (e.g., electrically connected) to the semiconductor pattern (130 of FIG. 6). The source layer 102 may be in contact with the bottom surface of the semiconductor pattern (130 of FIG. 6). The source layer 102 may not expose a sidewall of the semiconductor pattern (130 of FIG. 6). The source layer 102 may expose the bottom surface of the semiconductor pattern 130 (see FIG. 6). In this case, source support layer (104 of FIG. 3) may not be provided.

In some embodiments, a metal silicide layer 106 may be provided below the source layer 102 and the insulating substrate 101. The metal silicide layer 106 may be provided between the source layer 102 and the insulating substrate 101 and the second inter-wire insulating layer 220. Alternatively, the metal silicide layer 106 may not be provided.

Referring to FIG. 16, in the non-volatile memory device according to some embodiments, the front side of the cell substrate 100 may face that of the peripheral circuit substrate 200.

For example, the non-volatile memory device according to some embodiments may have a chip to chip (C2C) structure. The C2C structure means that an upper chip and a lower chip are connected to each other by a bonding method after the upper chip including a memory cell region CELL is manufactured on a first wafer (e.g., the cell substrate 100) and then the lower chip including a peripheral circuit region PERI is manufactured on a second wafer (e.g., the peripheral circuit substrate 200) different from the first wafer.

As an example, the bonding method may mean that a first bonding metal 190 formed on the uppermost metal layer of the upper chip and a second bonding metal 290 formed on the uppermost metal layer of the lower chip are electrically connected to each other. For example, when the first bonding metal 190 and the second bonding metal 290 are formed of copper (Cu), the bonding method may be a Cu—Cu bonding method, but this is only an example, and the first bonding metal 190 and the second bonding metal 290 may be formed of various other metals such as aluminum (Al) or tungsten (W).

As the first bonding metal 190 and the second bonding metal 290 are connected to each other, the first wiring pattern 170 may be connected (e.g., electrically connected) to the second wiring patterns 241 and 242. For example, the first bonding metal 190 may be connected (e.g., electrically connected) to the first wiring pattern 170 or the bit line BL through a third wiring contact 185. The second bonding metal 290 may be connected (e.g., electrically connected) to the second wiring patterns 241 and 242 through a fourth wiring contact 285. Therefore, each of the gate electrodes ECL, GSL, WL1 to WLn and SSL and/or the source layer 102 may be electrically connected to the peripheral circuit element PT. Each of the third wiring contact 185 and the fourth wiring contact 285 may include tungsten (W) or copper (Cu), but are not limited thereto.

In some embodiments, a third inter-wire insulating layer 145 may be on the cell substrate 100 and the insulating substrate 101. A third wiring pattern 147 may be in the third inter-wire insulating layer 145. The third wiring pattern 147 may be connected (e.g., electrically connected) to the cell contact 150. The third wiring pattern 147 may include tungsten (W) or copper (Cu), but is not limited thereto.

Hereinafter, a method of manufacturing a non-volatile memory device according to example embodiments will be described with reference to FIGS. 17 to 26. FIGS. 17 to 26 are intermediate views illustrating a method of manufacturing a non-volatile memory device according to some embodiments.

Figure 17:
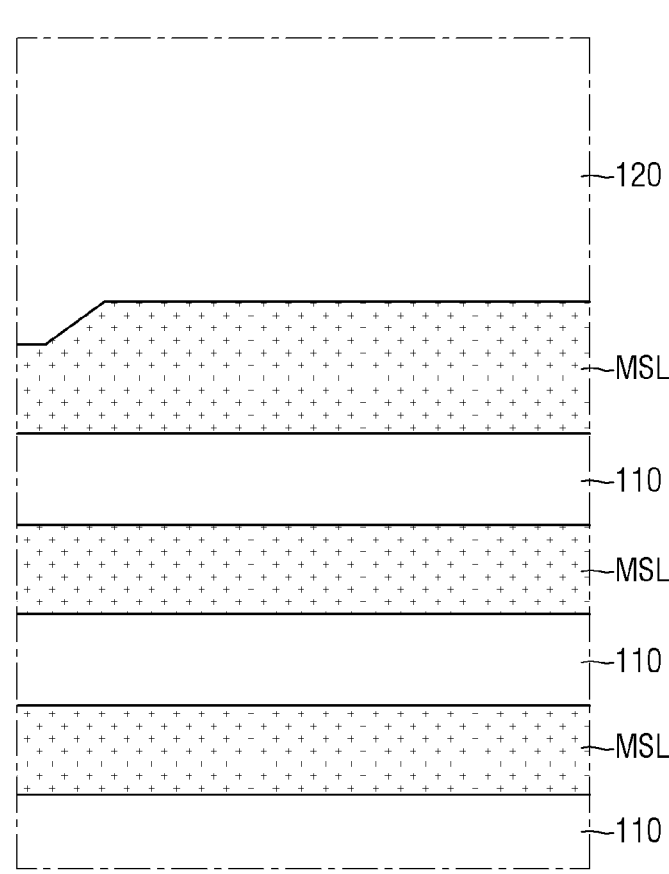

Referring to FIG. 17, a mold insulating layer 110 and a mold sacrificial layer MSL may be alternately stacked. That is, the mold sacrificial layer MSL may be provided between the mold insulating layers 110, and the mold insulating layer 110 may be provided between the mold sacrificial layers MSL. An interlayer insulating layer 120 may be formed on the uppermost mold sacrificial layer MSL.

The mold sacrificial layer MSL may include a material having an etching selectivity with respect to the mold insulating layer 110. For example, the mold sacrificial layer MSL may include a nitride-based insulating material. As an example, the mold sacrificial layer MSL may include silicon nitride, but is not limited thereto.

Figure 18:
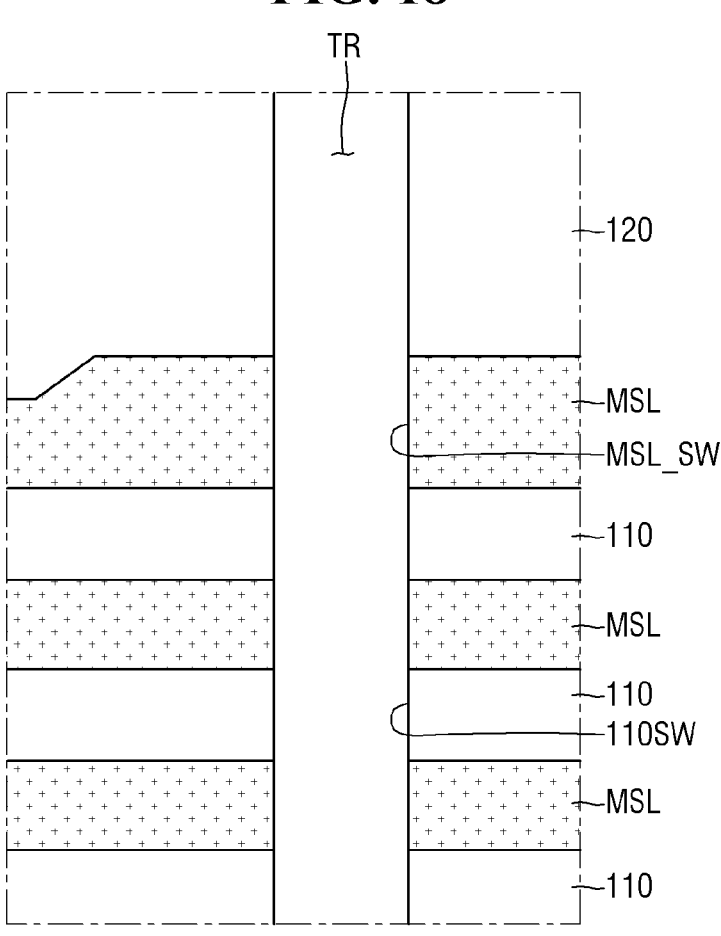

Referring to FIG. 18, a trench TR passing or extending through the interlayer insulating layer 120, the mold insulating layer 110 and the mold sacrificial layer MSL may be formed. The trench TR may expose the interlayer insulating layer 120, sidewalls 110SW of the mold insulating layer 110 and sidewalls MSL SW of the mold sacrificial layer MSL.

Figure 19:
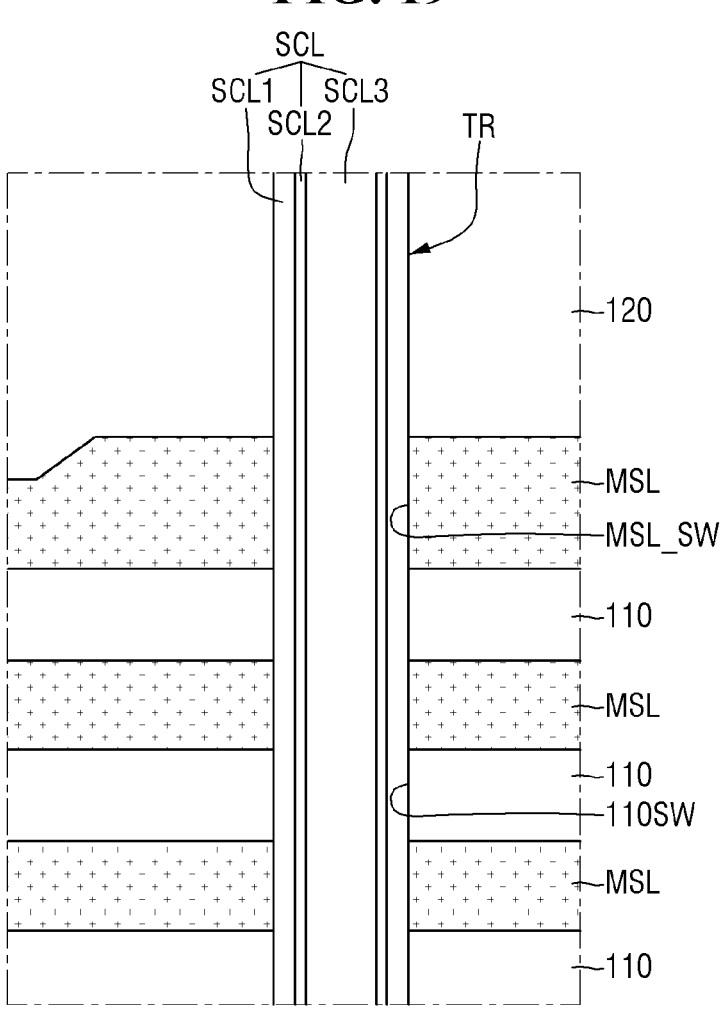

Referring to FIG. 19, a cell contact sacrificial layer SCL may be formed. The cell contact sacrificial layer SCL may fill or be in the trench TR. In detail, the cell contact sacrificial layer SCL may include a first sacrificial layer SCL1, a second sacrificial layer SCL2 and a third sacrificial layer SCL3. First, the first sacrificial layer SCL1 is formed along a sidewall and a bottom surface of the trench TR. Subsequently, the second sacrificial layer SCL2 is formed on the first sacrificial layer SCL1. Finally, the third sacrificial layer SCL3 is formed on the second sacrificial layer SCL2. The first sacrificial layer SCL1 and the second sacrificial layer SCL2 may include an insulating material. For example, the first sacrificial layer SCL1 may be formed of a silicon oxide layer. The second sacrificial layer SCL2 may be formed of a silicon nitride layer. The third sacrificial layer SCL3 may be formed of a polysilicon layer.

Figure 20:
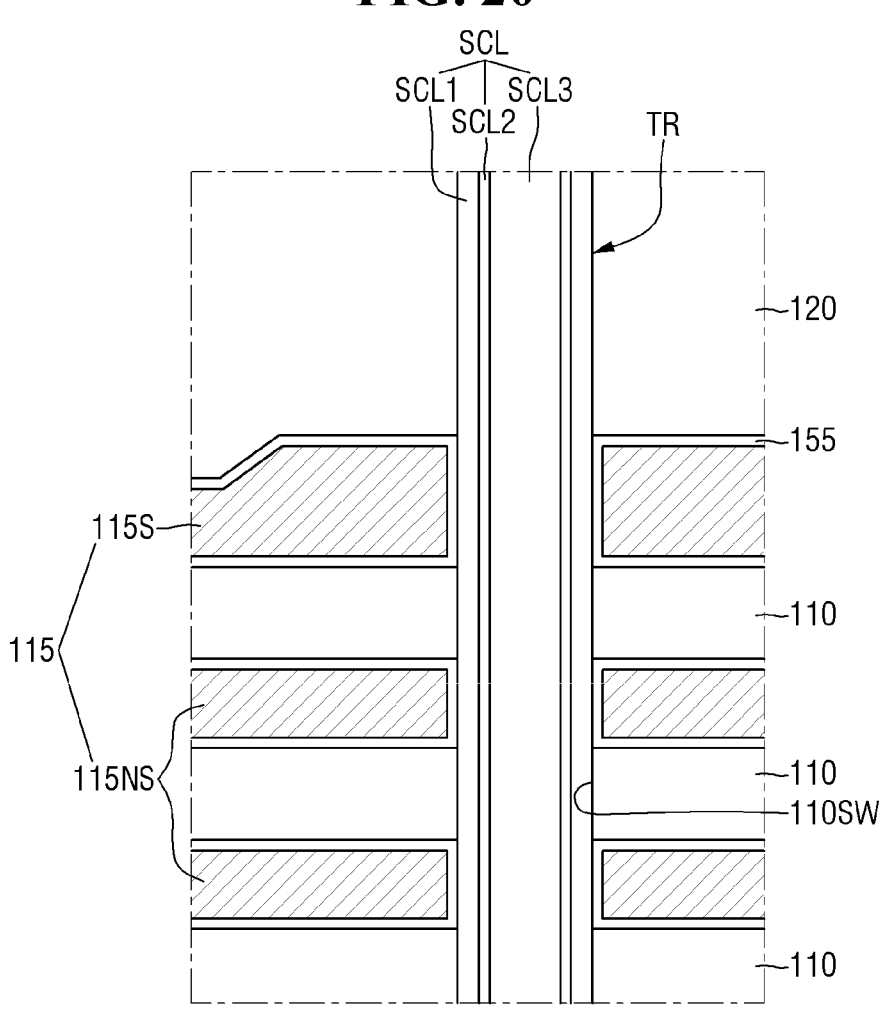

Referring to FIG. 20, gate electrodes 115 and a high dielectric constant layer 155 may be formed.

First, although not shown, the mold sacrificial layer MSL may be removed. The mold sacrificial layer MSL may be removed to expose a sidewall of the cell contact sacrificial layer SCL. In addition, the mold sacrificial layer MSL may be removed to expose a surface of the mold insulating layer 110. Subsequently, the high dielectric constant layer 155 may be formed along the surface of the mold insulating layer 110 and the sidewall of the cell contact sacrificial layer SCL. Although not shown, in a cell array region R1, the high dielectric constant layer 155 may be formed along a sidewall of a channel structure. Subsequently, gate electrodes 115 may be formed on the high dielectric constant layer 155. The gate electrodes 115 may include a selection gate electrode 115S and a non-selection gate electrode 115NS. For example, the high dielectric constant layer 155 may include hafnium oxide or aluminum oxide. The gate electrodes 115 may include tungsten (W) or molybdenum (Mo).

Figure 21:
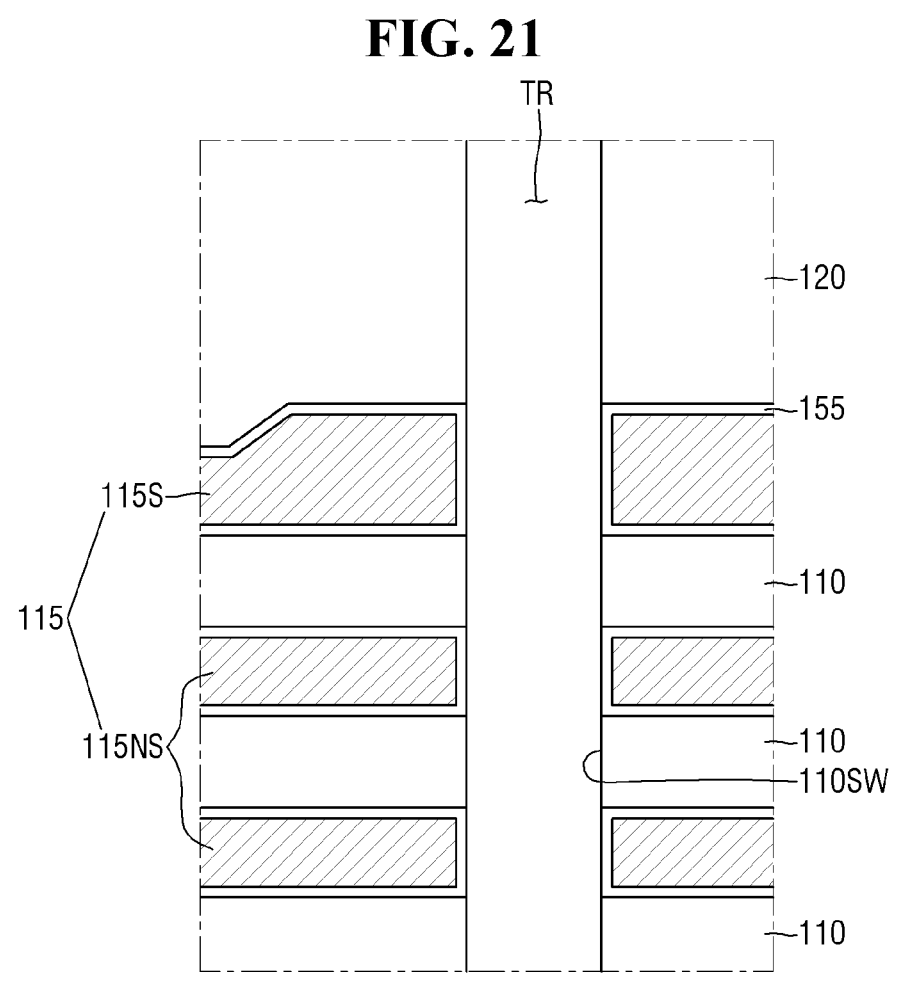

Referring to FIG. 21, the cell contact sacrificial layer SCL may be removed. The cell contact sacrificial layer SCL may be removed to expose a sidewall of the interlayer insulating layer 120, the sidewall 110SW of the mold insulating layer 110 and a surface of the high dielectric constant layer 155.

Figure 22:
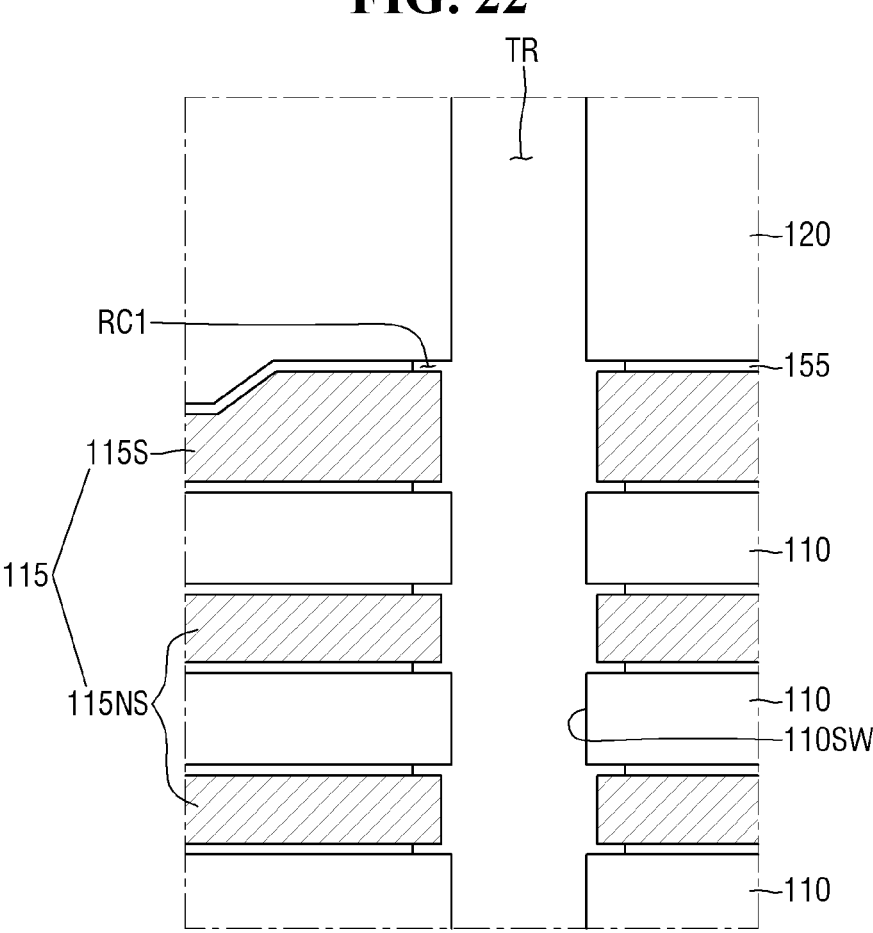

Referring to FIG. 22, a portion of the high dielectric constant layer 155 may be removed to form a first recess RC1. The high dielectric constant layer 155 may be removed using a wet etching process or a dry etching process. In some embodiments, the high dielectric constant layer 155 may have an etching selectivity with respect to the gate electrodes 115. Also, the high dielectric constant layer 155 may have an etching selectivity with respect to the interlayer insulating layer 120 and the mold insulating layer 110. Therefore, only the high dielectric constant layer 155 may be selectively removed to form the first recess RC1.

Figure 23:
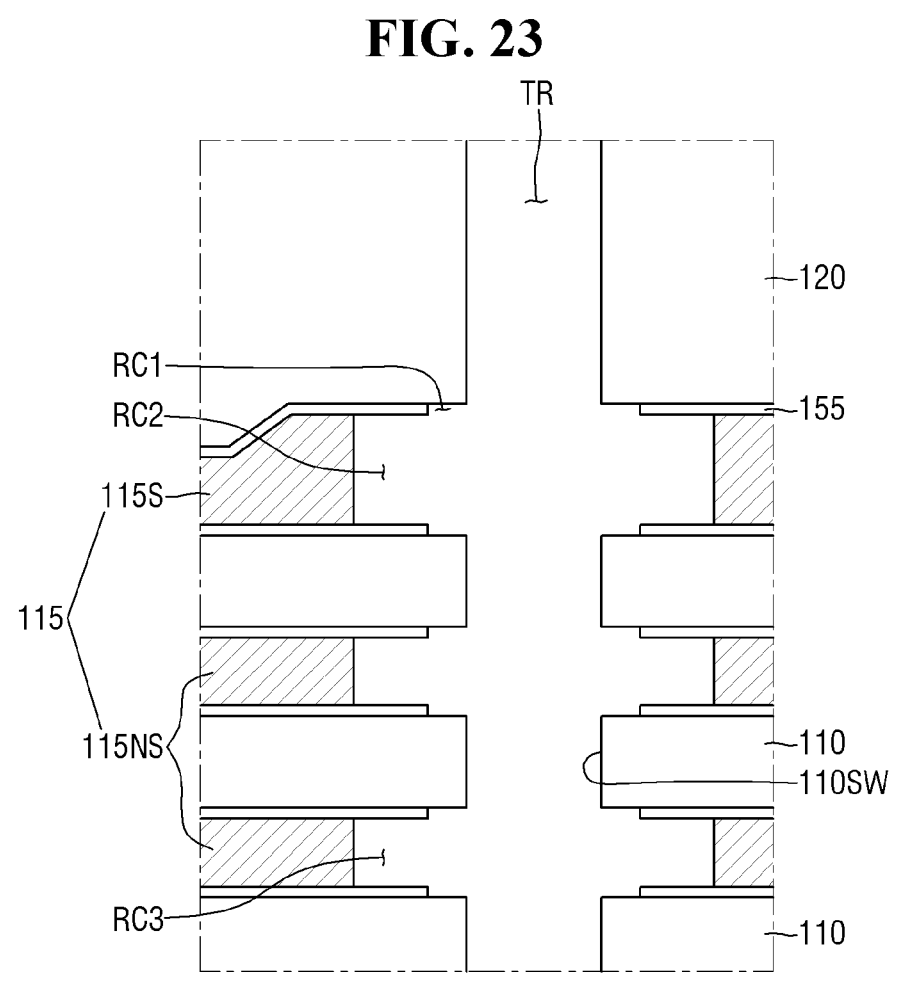

Referring to FIG. 23, a portion of the gate electrodes 115 may be removed. A second recess RC2 and a third recess RC3 may be formed by removing a portion of the gate electrodes 115. The second recess RC2 may be formed by removing a portion of the selection gate electrode 115S. The third recess RC3 may be formed by removing a portion of the non-selection gate electrode 115NS. As described above, the gate electrodes 115 may have an etching selectivity with respect to the high dielectric constant layer 155. Therefore, the high dielectric constant layer 155 may not be removed while the gate electrodes 115 are being removed.

Figure 24:
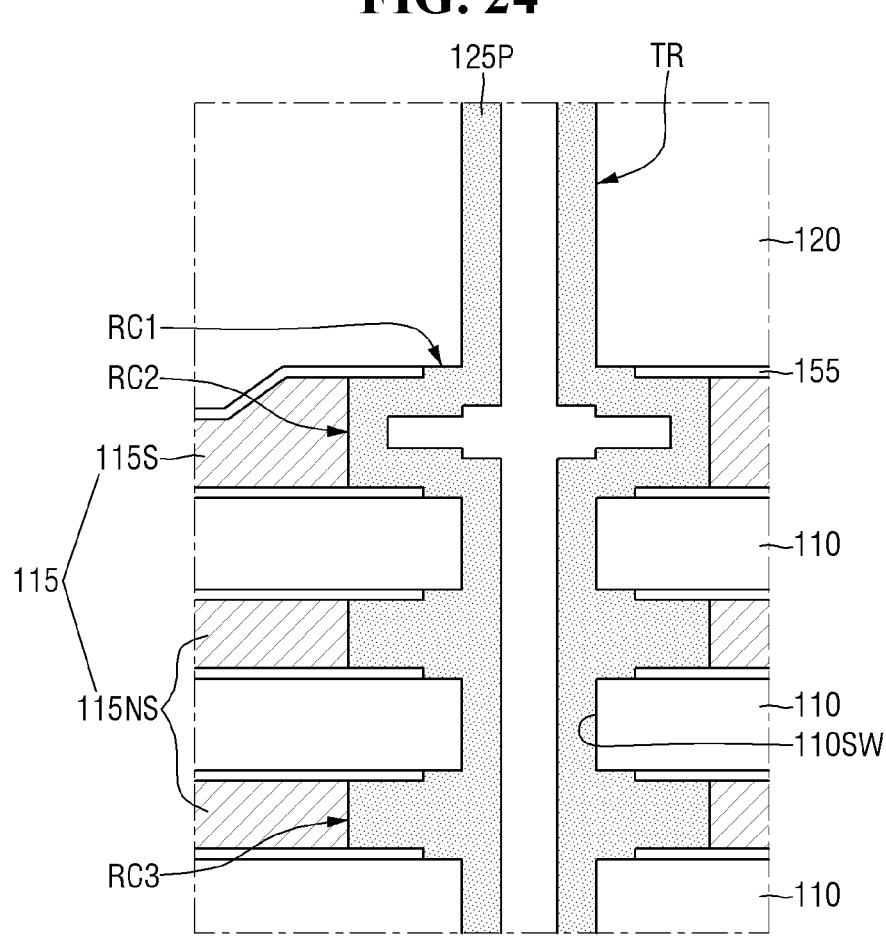

Referring to FIG. 24, a pre-insulating ring 125P may be formed. The pre-insulating ring 125P may be formed along the sidewall of the trench TR, the surface of the high dielectric constant layer 155, a sidewall of the selection gate electrode 115S, a sidewall of the non-selection gate electrode 115NS and the sidewall of the mold insulating layer 110. The pre-insulating ring 125P may include an insulating material. The pre-insulating ring 125P may include, for example, an oxide-based insulating material. For example, the pre-insulating ring 125P may include silicon oxide, but is not limited thereto.

Figure 25:
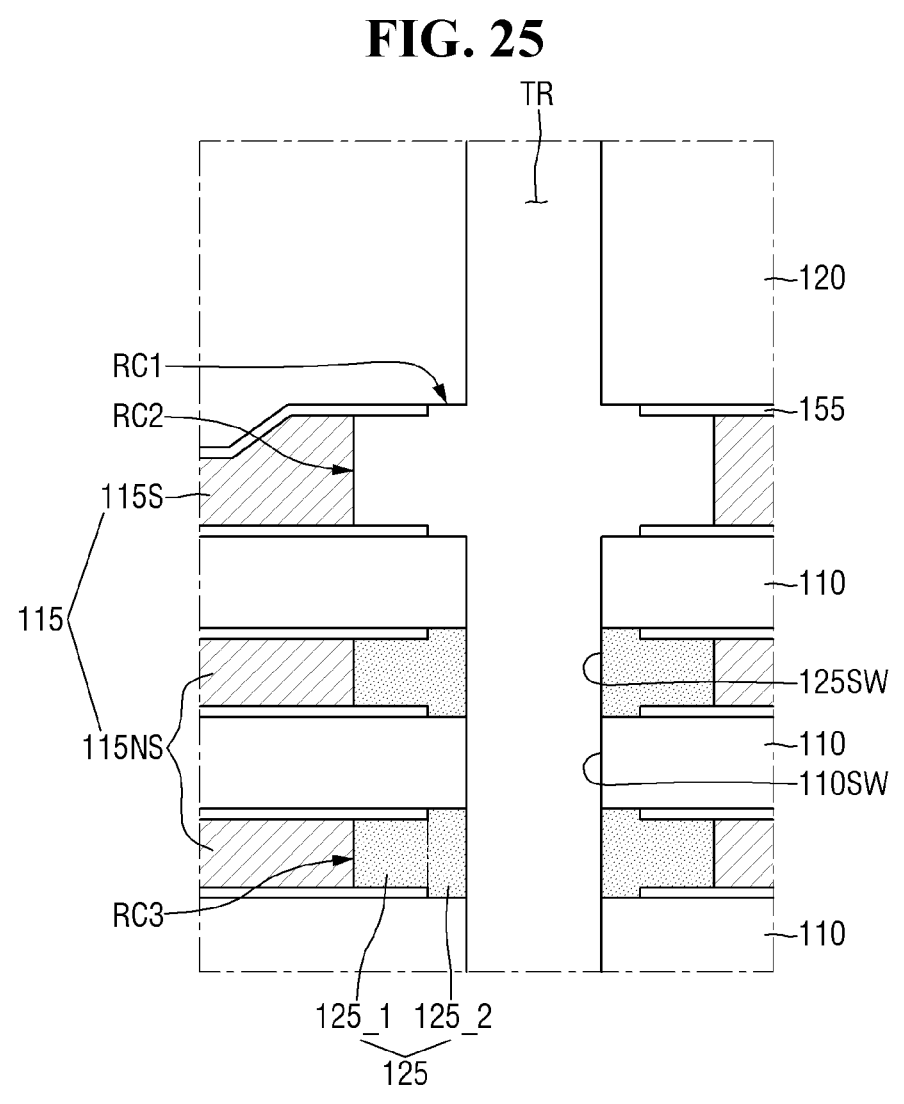

Referring to FIG. 25, a portion of the pre-insulating ring 125P may be removed to form the insulating ring 125. A portion of the pre-insulating ring 125P may be removed to expose the sidewall of the selection gate electrode 115S. However, even though a portion of the pre-insulating ring 125P is removed, the sidewall of the non-selection gate electrode 115NS may not be exposed. The insulating ring 125 may be formed on the sidewall of the non-selection gate electrode 115NS.

Figure 26:
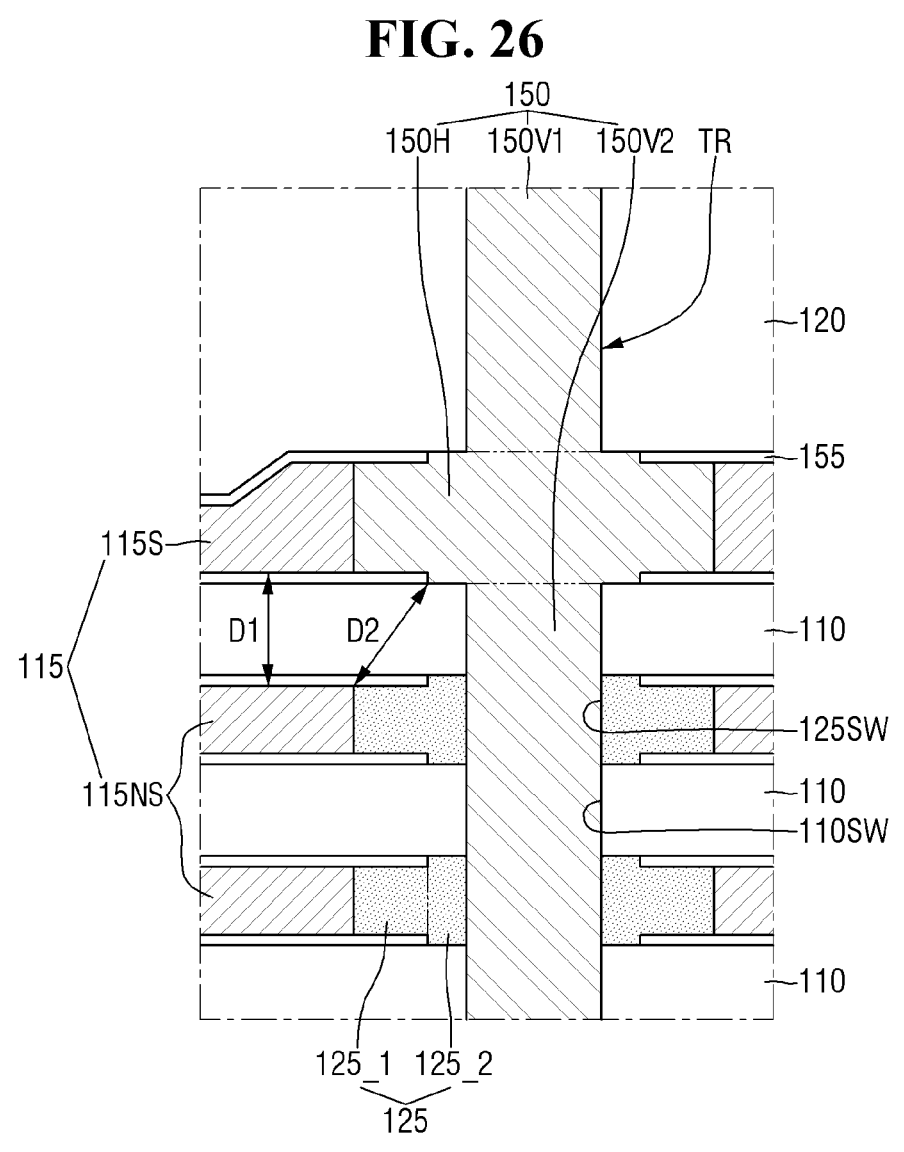

Referring to FIG. 26, a cell contact 150 may be formed to fill the trench TR. The cell contact 150 may be in contact with the sidewall of the selection gate electrode 115S. However, the cell contact 150 may not be in contact with the non-selection gate electrode 115NS. The insulating ring 125 may be between the cell contact 150 and the non-selection gate electrode 115NS. The insulating ring 125 may electrically insulate the cell contact 150 from the non-selection gate electrode 115NS.

In some embodiments, a minimum distance D1 between the non-selection gate electrode 115NS and the selection gate electrode 115S may be 15 nm or more. A minimum distance D2 between the non-selection gate electrode 115NS and the cell contact 150 may be 15 nm or more. In some embodiments, the minimum distance D2 between the non-selection gate electrode 115NS and the cell contact 150 may be 40 nm or more. The etching selectivity of the high dielectric constant layer 155 and the gate electrodes 115 may be used to make sure of the minimum distance D1 between the non-selection gate electrode 115NS and the selection gate electrode 115S and the minimum distance D2 between the non-selection gate electrode 115NS and the cell contact 150 in the range of 15 nm or more. Therefore, a non-volatile memory device with improved reliability may be manufactured.

Hereinafter, an electronic system including a non-volatile memory device according to example embodiments will be described with reference to FIGS. 1 to 16 and 27 to 29.

Figure 27:
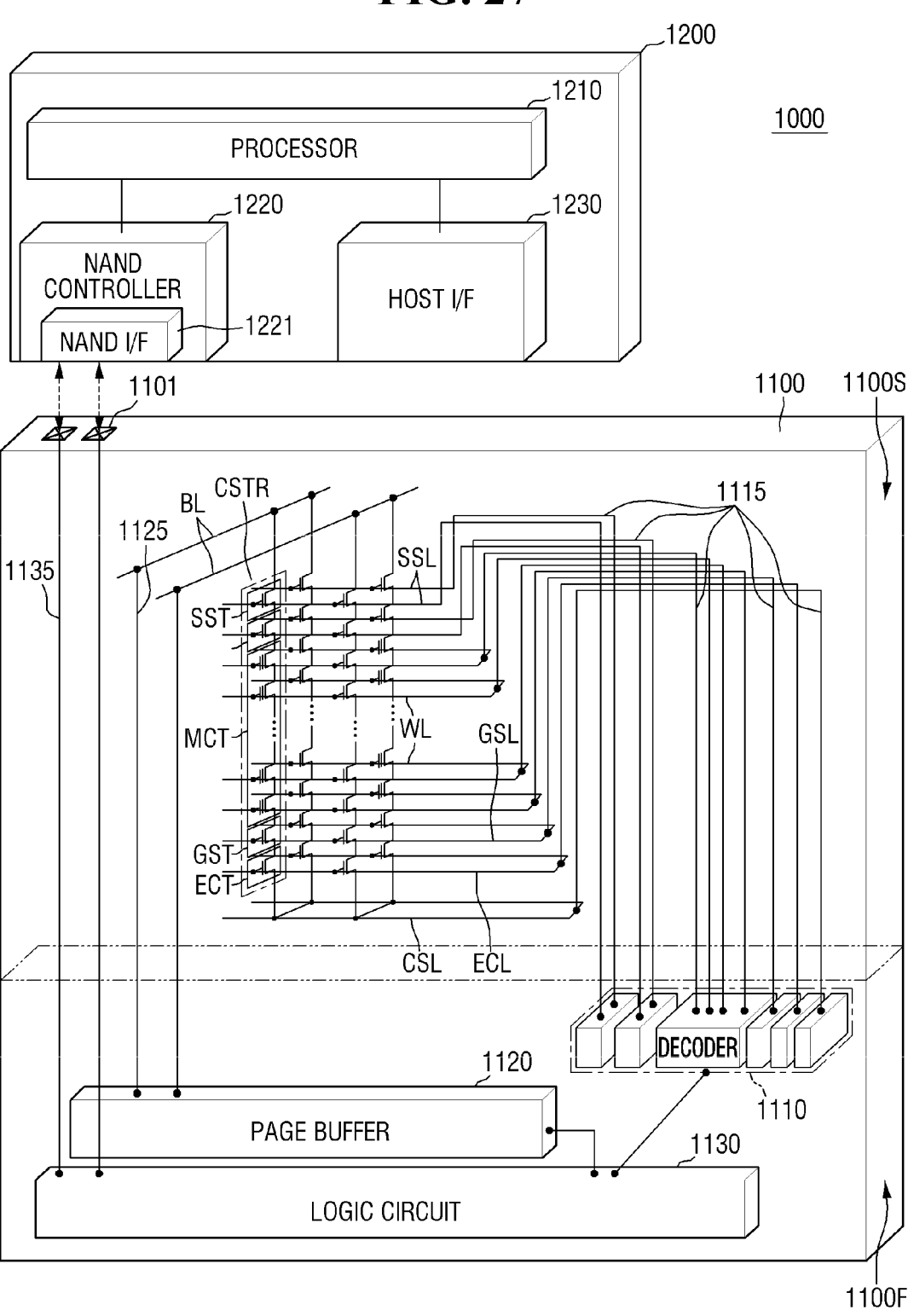
FIG. 27 is an example block diagram illustrating an electronic system according to some embodiments.
Figure 28:
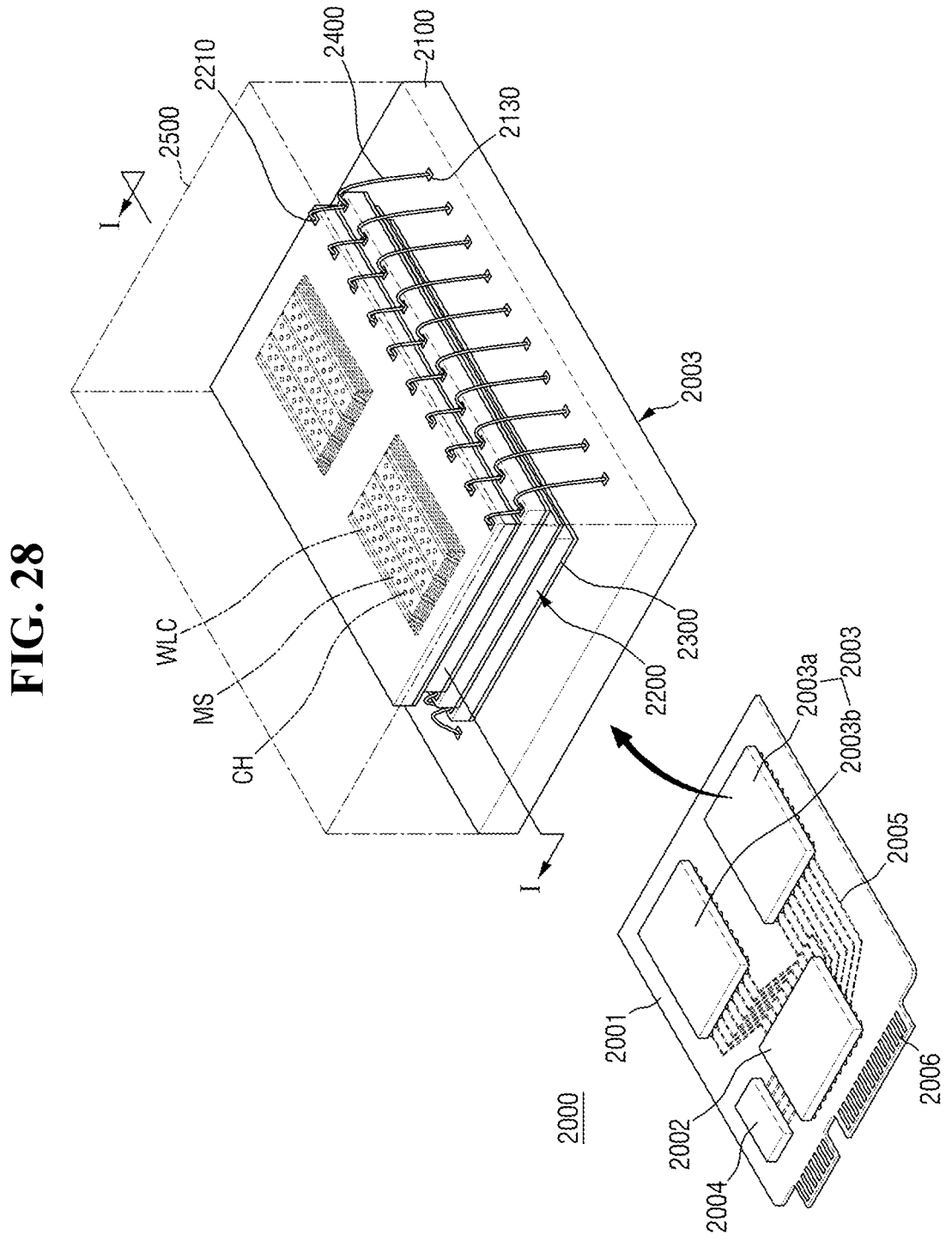
FIG. 28 is an example perspective view illustrating an electronic system according to some embodiments.
Figure 29:
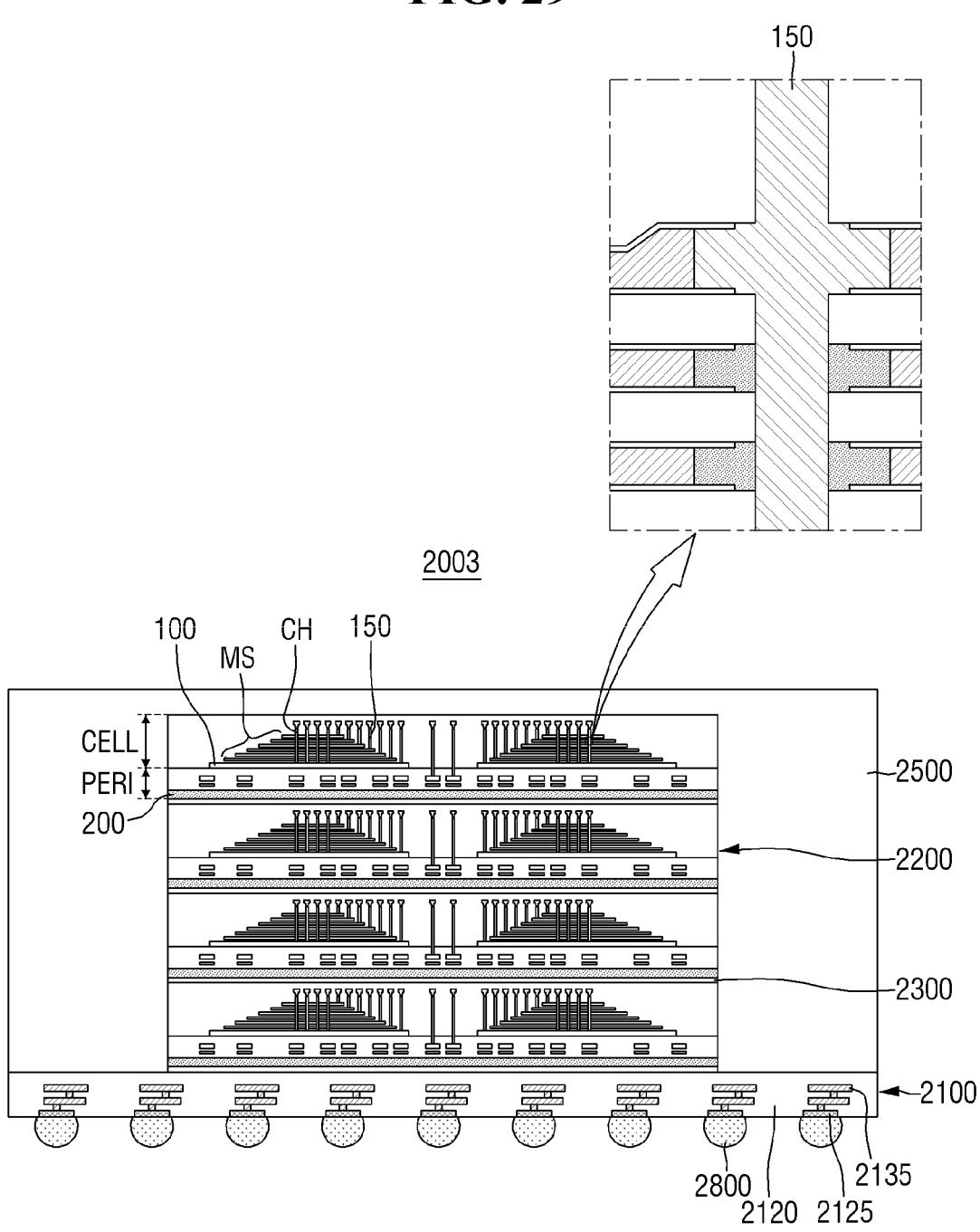
FIG. 29 is a cross-sectional view taken along line I-I of FIG. 28.

FIG. 27 is an example block diagram illustrating an electronic system according to some embodiments. FIG. 28 is an example perspective view illustrating an electronic system according to some embodiments. FIG. 29 is a cross-sectional view taken along line I-I of FIG. 28.

Referring to FIG. 27, an electronic system 1000 according to some embodiments may include a non-volatile memory device 1100 and a controller 1200 electrically connected to the non-volatile memory device 1100. The electronic system 1000 may be a storage device including one or more non-volatile memory devices 1100, or may be an electronic device including a storage device. For example, the electronic system 1000 may be a solid state drive (SSD) device, a universal serial bus (USB), a computing system, a medical device or a communication device, which includes one or more non-volatile memory devices 1100.

The non-volatile memory device 1100 may be, for example, a NAND flash memory device, and may be, for example, the non-volatile memory device described above with reference to FIGS. 1 to 16. The non-volatile memory device 1100 may include a first structure 1100F and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1) and a logic circuit 1130 (e.g., the control logic 37 of FIG. 1).

The second structure 1100S may include the common source line CSL, the plurality of bit lines BL and the plurality of cell strings CSTR, which are described with reference to FIG. 2. The cell strings CSTR may be connected to the decoder circuit 1110 through a word line WL, at least one string selection line SSL and at least one ground selection line GSL. In addition, the cell strings CSTR may be connected to the page buffer 1120 through bit lines BL.

In some embodiments, the common source line CSL and the cell strings CSTR may be electrically connected to the decoder circuit 1110 through first connection lines 1115 that extend from the first structure 1100F to the second structure 1100S.

In some embodiments, the bit lines BL may be electrically connected to the page buffer 1120 through second connection lines 1125 that extend from the first structure 1100F to the second structure 1100S.

The non-volatile memory device 1100 may perform communication with the controller 1200 through an input/output pad 1101 electrically connected to the logic circuit 1130 (e.g., the control logic 37 of FIG. 1). The input/output pad 1101 may be electrically connected to the logic circuit 1130 through an input/output connection line 1135 that extends from the first structure 1100F to the second structure 1100S.

The controller 1200 may include a processor 1210, a NAND controller 1220 and a host interface 1230. In some embodiments, the electronic system 1000 may include a plurality of non-volatile memory devices 1100, and in this case, the controller 1200 may control the plurality of non-volatile memory devices 1100.

The processor 1210 may control overall operations of the electronic system 1000 including the controller 1200. The processor 1210 may operate in accordance with predetermined firmware, and may access the non-volatile memory device 1100 by controlling the NAND controller 1220. The NAND controller 1220 may include a NAND interface 1221 for processing communication with the non-volatile memory device 1100. A control command for controlling the non-volatile memory device 1100, data to be written in memory cell transistors MCT of the non-volatile memory device 1100, data to be read from the memory cell transistors MCT of the non-volatile memory device 1100 and the like may be transmitted through the NAND interface 1221. The host interface 1230 may provide a communication function between the electronic system 1000 and an external host. When the control command is received from the external host through the host interface 1230, the processor 1210 may control the non-volatile memory device 1100 in response to the control command.

Referring to FIGS. 27 to 29, the electronic system according to some embodiments may include a main board 2001, a main controller 2002 packaged on the main board 2001, one or more semiconductor packages 2003, and a DRAM 2004. The semiconductor package 2003 and the DRAM 2004 may be connected to the main controller 2002 by wiring patterns 2005 formed in the main board 2001.

The main board 2001 may include a connector 2006 that includes a plurality of pins coupled to the external host. The number and arrangement of the plurality of pins in the connector 2006 may be varied depending on a communication interface between the electronic system 2000 and the external host. In some embodiments, the electronic system 2000 may perform communication with the external host in accordance with any one of interfaces such as a Universal Serial Bus (USB), a Peripheral Component Interconnect Express (PCI-Express), Serial Advanced Technology Attachment (SATA), and M-Phy for Universal Flash Storage (UFS). In some embodiments, the electronic system 2000 may operate in accordance with a power source supplied from the external host through the connector 2006. The electronic system 2000 may further include a power management integrated circuit (PMIC) that distributes the power source supplied from the external host to the main controller 2002 and the semiconductor package 2003.

The main controller 2002 may write data in the semiconductor package 2003 or read the data from the semiconductor package 2003, and may improve the operating speed of the electronic system 2000.

The DRAM 2004 may be a buffer memory for mitigating a speed difference between the semiconductor package 2003 that is a data storage space and the external host. The DRAM 2004 included in the electronic system 2000 may also operate as a kind of a cache memory, and may provide a space for temporarily storing data in a control operation for the semiconductor package 2003. When the DRAM 2004 is included in the electronic system 2000, the main controller 2002 may further include a DRAM controller for controlling the DRAM 2004, in addition to the NAND controller for controlling the semiconductor package 2003.

The semiconductor package 2003 may include a first semiconductor package 2003a and a second semiconductor package 2003b, which are spaced apart from each other. Each of the first semiconductor package 2003a and the second semiconductor package 2003b may be a semiconductor package that includes a plurality of semiconductor chips 2200. Each of the first semiconductor package 2003a and the second semiconductor package 2003b may include a package substrate 2100, semiconductor chips 2200 on the package substrate 2100, adhesive layers 2300 on a lower surface of each of the semiconductor chips 2200, a connection structure 2400 for electrically connecting the semiconductor chips 2200 with the package substrate 2100, and a molding layer 2500 covering the semiconductor chips 2200 and the connection structure 2400 on the package substrate 2100.

The package substrate 2100 may be a printed circuit board that includes package upper pads 2130. Each semiconductor chip 2200 may include an input/output pad 2210. The input/output pad 2210 may correspond to the input/output pad 1101 of FIG. 27.

In some embodiments, the connection structure 2400 may be a wire bonding for electrically connecting the input/output pad 2210 with the package upper pads 2130. Therefore, in each of the first semiconductor package 2003*a* and the second semiconductor package 2003*b*, the semiconductor chips 2200 may be electrically connected to each other in a wire bonding manner, and may be electrically connected to the package upper pads 2130 of the package substrate 2100. In some embodiments, in each of the first semiconductor package 2003*a* and the second semiconductor package 2003*b*, the semiconductor chips 2200 may be electrically connected to each other by a connection structure that includes a through silicon via (TSV), instead of the connection structure 2400 of the wire bonding manner.

In some embodiments, the main controller 2002 and the semiconductor chips 2200 may be included in one package. In some embodiments, the main controller 2002 and the semiconductor chips 2200 may be packaged in a separate interposer substrate different from the main board 2001, and the main controller 2002 may be connected with the semiconductor chips 2200 by a wiring formed in the interposer substrate.

In some embodiments, the package substrate 2100 may be a printed circuit board. The package substrate 2100 may include a package substrate body portion 2120, package upper pads 2130 on an upper surface of the package substrate body portion 2120, lower pads 2125 on a lower surface of the package substrate body portion 2120 or exposed through the lower surface, and internal wires 2135 electrically connecting the upper pads 2130 with the lower pads 2125 inside the package substrate body portion 2120. The upper pads 2130 may be electrically connected to the connection structures 2400. The lower pads 2125 may be connected to the wiring patterns 2005 of the main board 2001 of the electronic system 2000 through conductive connectors 2800 as shown in FIGS. 28 and 29.

Referring to FIGS. 28 and 29, in the electronic system according to some embodiments, each of the semiconductor chips 2200 may include the semiconductor memory device described with reference to FIGS. 1 to 16. For example, each of the semiconductor chips 2200 may include a peripheral circuit region PERI and a memory cell region CELL stacked on the peripheral circuit region PERI. Illustratively, the peripheral circuit region PERI may include the peripheral circuit substrate 200 and the second wiring patterns 241 and 242, which are described with reference to FIGS. 3 to 7. Also, the memory cell region CELL may include the cell substrate 100, the mold structure MS, the channel structure CH, the block isolation region WLC, the bit line BL and the cell contact 150, which are described with reference to FIGS. 3 to 7.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A non-volatile memory device comprising:
a substrate that includes a cell array region and an extension region;
a mold structure that includes a plurality of gate electrodes stacked on the cell array region and the extension region and a plurality of mold insulating layers alternately stacked with the plurality of gate electrodes, wherein the plurality of gate electrodes are stacked on the extension region in a stepped shape;
a channel structure on the cell array region, wherein the channel structure intersects the plurality of gate electrodes and extends at least partially through the mold structure;
a cell contact on the extension region, wherein the cell contact extends at least partially through the mold structure, is electrically connected to a selection gate electrode of the plurality of gate electrodes and is not electrically connected to a non-selection gate electrode of the plurality of gate electrodes;
an insulating ring on the extension region, wherein the insulating ring is between the non-selection gate electrode and a sidewall of the cell contact and is in contact with the non-selection gate electrode; and
a high dielectric constant layer between respective ones of the plurality of gate electrodes and respective ones of the plurality of mold insulating layers,
wherein the insulating ring includes a first portion that overlaps the high dielectric constant layer in a vertical direction, and a second portion that does not overlap the high dielectric constant layer in the vertical direction.

2. The non-volatile memory device of claim 1, wherein a horizontal width of the first portion of the insulating ring is greater than that of the second portion of the insulating ring.

3. The non-volatile memory device of claim 1, wherein a sidewall of the selection gate electrode and a sidewall of the non-selection gate electrode are coplanar.

4. The non-volatile memory device of claim 1, wherein a horizontal width of the first portion of the insulating ring is smaller than that of the second portion of the insulating ring.

5. The non-volatile memory device of claim 1, wherein a sidewall of the insulating ring and respective sidewalls of the plurality of mold insulating layers are coplanar.

6. The non-volatile memory device of claim 1, wherein a sidewall of the insulating ring and a sidewall of one or more of the plurality of mold insulating layers are not coplanar.

7. The non-volatile memory device of claim 1, wherein a minimum distance between the non-selection gate electrode and the selection gate electrode is 15 nanometers (nm) or more, and a minimum distance between the non-selection gate electrode and the cell contact is 15 nm or more.

8. The non-volatile memory device of claim 7, wherein the minimum distance between the non-selection gate electrode and the cell contact is 40 nm or more.

9. The non-volatile memory device of claim 1, wherein the mold structure includes a lower mold structure and an upper mold structure on the lower mold structure.

10. The non-volatile memory device of claim 1, wherein the insulating ring has a 'T' shape that is rotated by 90°, in a cross-sectional view.

11. The non-volatile memory device of claim 1, wherein the non-selection gate electrode is at an uppermost end of the plurality of gate electrodes.

12. The non-volatile memory device of claim 1, wherein the high dielectric constant layer includes a first portion that is in contact with the selection gate electrode, and a second portion that is in contact with the non-selection gate electrode, and
the first portion of the high dielectric constant layer is in contact with the cell contact and the second portion of the high dielectric constant layer is not in contact with the cell contact.

13. The non-volatile memory device of claim 1, wherein a height of the first portion of the insulating ring in the vertical direction is less than that of the second portion of the insulating ring.

14. A non-volatile memory device comprising:

a peripheral circuit substrate;

a peripheral circuit element on the peripheral circuit substrate;

a cell substrate on the peripheral circuit substrate, wherein the cell substrate includes a cell array region and an extension region;

a lower mold structure that includes a plurality of lower gate electrodes stacked on the cell array region and the extension region and a plurality of lower mold insulating layers alternately stacked with the plurality of lower gate electrodes, wherein the plurality of lower gate electrodes are stacked on the extension region in a stepped shape;

an upper mold structure on the lower mold structure, wherein the upper mold structure includes a plurality of upper gate electrodes stacked on the cell array region and the extension region and a plurality of upper mold insulating layers alternately stacked with the plurality of upper gate electrodes, and the plurality of upper gate electrodes are stacked on the extension region in a stepped shape;

a channel structure on the cell array region, wherein the channel structure extends at least partially through the lower mold structure and the upper mold structure;

a cell contact on the extension region, wherein the cell contact extends at least partially through the lower mold structure and the upper mold structure and is electrically connected to a selection gate electrode of the plurality of lower and upper gate electrodes and is not electrically connected to a plurality of non-selection gate electrodes of the plurality of lower and upper gate electrodes;

an insulating ring on the extension region, wherein the insulating ring is between respective ones of the plurality of non-selection gate electrodes and a sidewall of the cell contact and is in contact with the plurality of non-selection gate electrodes; and a high dielectric constant layer between respective ones of the plurality of lower and upper gate electrodes and respective ones of the plurality of lower and upper mold insulating layers, wherein the cell contact includes a horizontal portion electrically connected to the selection gate electrode, a first vertical portion on the horizontal portion and a second vertical portion below the horizontal portion, at least a portion of the insulating ring is in contact with the first vertical portion and the second vertical portion, the insulating ring includes a first portion that overlaps the high dielectric constant layer in a vertical direction, and a second portion that does not overlap the high dielectric constant layer in the vertical direction, a height of the first portion of the insulating ring in the vertical direction is less than that of the second portion of the insulating ring, a horizontal width of the first portion of the insulating ring is greater than that of the second portion of the insulating ring, the high dielectric constant layer includes a first portion that is in contact with the selection gate electrode, and a second portion that is in contact with the plurality of non-selection gate electrodes, the first portion of the high dielectric constant layer is in contact with the cell contact, and the second portion of the high dielectric constant layer is not in contact with the cell contact.

15. The non-volatile memory device of claim 14, wherein a sidewall of the selection gate electrode and respective sidewalls of the plurality of non-selection gate electrodes are coplanar.

16. The non-volatile memory device of claim 14, wherein a sidewall of the insulating ring has a curved shape.

17. The non-volatile memory device of claim 14, wherein the horizontal portion of the cell contact includes a first portion that overlaps the high dielectric constant layer in the vertical direction, and a second portion that does not overlap the high dielectric constant layer in the vertical direction, and a height of the first portion in the vertical direction is less than that of the second portion.

18. The non-volatile memory device of claim 14, wherein a minimum distance between the selection gate electrode and a respective one of the plurality of non-selection gate electrodes adjacent to the selection gate electrode is 15 nanometers (nm) or more, and a minimum distance between the cell contact and the respective one of the plurality of non-selection gate electrodes adjacent to the selection gate electrode is 15 nm or more.

19. The non-volatile memory device of claim 18, wherein the minimum distance between the cell contact and the respective one of the plurality of non-selection gate electrodes adjacent to the selection gate electrode is 40 nm or more.

20. An electronic system comprising:

a main board;

a non-volatile memory device on the main board; and a controller on the main board, wherein the controller is electrically connected to the non-volatile memory device, wherein the non-volatile memory device comprises:

a substrate that includes a cell array region and an extension region;

a mold structure that includes a plurality of gate electrodes stacked on the cell array region and the extension region and a plurality of mold insulating layers alternately stacked with the plurality of gate electrodes, wherein the plurality of gate electrodes are stacked on the extension region in a stepped shape;

a channel structure on the cell array region, wherein the channel structure intersects the plurality of gate electrodes and extends at least partially through the mold structure;

a cell contact on the extension region, wherein the cell contact extends at least partially through the mold structure, is electrically connected to a selection gate electrode of the plurality of gate electrodes and is not electrically connected to a non-selection gate electrode of the plurality of gate electrodes;

an insulating ring on the extension region, wherein the insulating ring is between the non-selection gate electrode and a sidewall of the cell contact and is in contact with the non-selection gate electrode; and a high dielectric constant layer between respective ones of the plurality of gate electrodes and respective ones of the plurality of mold insulating layers, wherein the insulating ring includes a first portion that overlaps the high dielectric constant layer in a vertical direction, and a second portion that does not overlap the high dielectric constant layer in the vertical direction.

* * * * *